United States Patent
Shionoiri et al.

(10) Patent No.: US 8,540,161 B2
(45) Date of Patent: Sep. 24, 2013

(54) SEMICONDUCTOR DEVICE AND METHOD FOR MANUFACTURING THE SAME

(75) Inventors: Yutaka Shionoiri, Isehara (JP); Tatsuji Nishijima, Atsugi (JP); Misako Sato, Atsugi (JP); Shuhei Maeda, Fuchu (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 100 days.

(21) Appl. No.: 13/187,777

(22) Filed: Jul. 21, 2011

(65) Prior Publication Data

US 2012/0024963 A1 Feb. 2, 2012

(30) Foreign Application Priority Data

Jul. 29, 2010 (JP) ................................. 2010-169906

(51) Int. Cl.
*G06K 19/06* (2006.01)

(52) U.S. Cl.
USPC .......................................... 235/492; 235/486

(58) Field of Classification Search
USPC ........................... 235/492, 486, 487, 491, 375
See application file for complete search history.

(56) References Cited

U.S. PATENT DOCUMENTS

| | | | |
|---|---|---|---|
| 5,625,549 A | | 4/1997 | Horvat |
| 5,985,215 A | * | 11/1999 | Sakazume et al. .............. 422/67 |
| 7,424,265 B2 | | 9/2008 | Umeda et al. |
| 7,703,677 B2 | | 4/2010 | Alihodzic |
| 7,732,945 B2 | | 6/2010 | Gotoh et al. |
| 2002/0118557 A1 | | 8/2002 | Ohlsson |
| 2008/0311850 A1 | | 12/2008 | Ootaka et al. |
| 2010/0072271 A1 | * | 3/2010 | Thorstensson ................ 235/375 |
| 2010/0270868 A1 | * | 10/2010 | Hanaoka et al. .............. 307/104 |
| 2011/0002150 A1 | | 1/2011 | Yoo et al. |
| 2011/0027980 A1 | * | 2/2011 | Yamazaki et al. ............ 438/591 |
| 2011/0089414 A1 | | 4/2011 | Yamazaki et al. |
| 2011/0101331 A1 | | 5/2011 | Yamazaki et al. |
| 2011/0121887 A1 | | 5/2011 | Kato |
| 2011/0127338 A1 | | 6/2011 | Shionoiri |
| 2012/0158607 A1 | * | 6/2012 | Burns et al. ................... 705/333 |

FOREIGN PATENT DOCUMENTS

JP 2008-236961 10/2008

* cited by examiner

*Primary Examiner* — Thien M Le
(74) *Attorney, Agent, or Firm* — Eric J. Robinson; Robinson Intellectual Property Law Office, P.C.

(57) ABSTRACT

An object of this invention is to provide a semiconductor device (an RFID) with reduced loss of voltage/current corresponding to a threshold value of a transistor, and having a voltage/current rectification property. Another object of this invention is to simplify a fabrication process and a circuit configuration. A rectifier circuit is provided in an element included in a semiconductor device (RFID) capable of communicating data wirelessly. As compared to the case where only a diode is provided, coils are provided between gate terminals and drain terminals of transistors constituting the diode in a rectifier circuit, so that the coils overlap an antenna which receives a radio wave, whereby a voltage output by the rectifier circuit is increased using electromagnetic coupling between the antenna which receives a radio wave and the coils, so that the rectification efficiency is improved.

31 Claims, 12 Drawing Sheets

300  301  302

311
310  312

321
322
320

X1  X2
422

X3  X4
422

X5  X6
422

SEMICONDUCTOR DEVICE AND METHOD FOR MANUFACTURING THE SAME

BACKGROUND OF THE INVENTION

1. Field of the Invention

The present invention relates to a semiconductor device having a rectifier circuit and a method for manufacturing the semiconductor device.

2. Description of the Related Art

In recent years, semiconductor devices which transmit and receive data wirelessly have been actively developed. Semiconductor devices transmitting and receiving data wirelessly are called radio frequency identification (RFID) tags, ID tags, IC tags, IC chips, RF tags, wireless tags, electronic tags, wireless chips, transponders, or the like, and those put in practical use generally include a silicon substrate.

A semiconductor device which transmits and receives data wirelessly (hereinafter referred to as an RFID) has a function of converting a wireless signal (a carrier wave or an amplitude modulation wave generated by superimposing a modulation wave on a carrier wave) into a DC voltage with a rectifier circuit which is provided in the RFID, and circuits in the RFID operate using the DC voltage.

A rectifier circuit which is provided in an RFID generally includes a diode using a transistor.

In the case where a diode using a transistor is used for a rectifier circuit, there has been a problem in that, compared to an ideal voltage or current output by the diode, a loss of voltage/current corresponding to a threshold value characteristic of the transistor occurs.

Further, a method is known in which stabilization is achieved by provision of a voltage control circuit in a rectifier circuit (for example, see Patent Document 1).

REFERENCE

[Patent Document 1] Japanese Published Patent Application No. 2008-236961

SUMMARY OF THE INVENTION

However, the method described in Patent Document 1 has a problem in that a process and a circuit configuration become complicated.

One embodiment of the present invention is made in view of the above problems, and it is an object to provide a semiconductor device (an RFID) which reduces the loss of voltage/current which corresponds to the threshold value of a transistor and has a rectification property for simplification of a process and a circuit configuration in the case where a diode using a transistor is used for a rectifier circuit.

Rectification efficiency is improved by connecting a coil between a gate terminal and a drain terminal of a transistor included in a rectifier circuit.

Specifically, as compared to the case where only a diode is provided, a coil is provided between an antenna which receives a radio wave and a gate terminal and a drain terminal of a transistor in a rectifier circuit, whereby a voltage output by a diode and the coil is increased using electromagnetic coupling between the antenna which receives a radio wave and the coil, so that the rectification efficiency is improved. Details thereof will be described below.

One embodiment of the present invention is a semiconductor device including an antenna and a rectifier circuit which rectifies a carrier wave or an amplitude modulation wave which is received via the antenna. The rectifier circuit includes a first transistor, a second transistor, a first capacitor, a second capacitor, a first coil, and a second coil. The first transistor includes a first gate electrode, a first source electrode, and a first drain electrode. The second transistor includes a second gate electrode, a second source electrode, and a second drain electrode. The first coil is connected between the first gate electrode and the first drain electrode. The second coil is connected between the second gate electrode and the second drain electrode. Rectification efficiency of a carrier wave or an amplitude modulation wave which is received via the antenna is enhanced by the first coil and the second coil.

In the above structure, the semiconductor device may include a demodulation circuit which is electrically connected to the antenna; a modulation circuit which is electrically connected to the demodulation circuit; a constant voltage circuit which is electrically connected to the rectifier circuit; and a logic circuit which is electrically connected to the demodulation circuit, the modulation circuit, and the constant voltage circuit.

In the above structure, the semiconductor device may include a demodulation circuit which is electrically connected to the antenna; a modulation circuit which is electrically connected to the demodulation circuit; a constant voltage circuit which is electrically connected to the rectifier circuit; a logic circuit which is electrically connected to the demodulation circuit, the modulation circuit, and the constant voltage circuit; and a clock generation circuit which is connected between the constant voltage circuit and the logic circuit.

In the above structure, the first coil and the second coil may be provided so as to overlap with the antenna with an insulating layer interposed therebetween.

In the above structure, the first coil and the second coil may be formed using a conductive layer containing an element selected from aluminum, chromium, tantalum, titanium, molybdenum, tungsten, silver, copper, gold, platinum, nickel and palladium.

In the above structure, the first transistor and the second transistor may include an oxide semiconductor material.

Another embodiment of the present invention is a method for manufacturing a semiconductor device including the steps of forming a first insulating layer over a substrate; forming a semiconductor layer over the first insulating layer; forming a gate insulating layer over the semiconductor layer; forming a gate electrode layer over the gate insulating layer; forming a second insulating layer over the gate electrode layer: forming a source electrode layer and a drain electrode layer which are in contact with the semiconductor layer over the second insulating layer; forming a third insulating layer over the second insulating layer, the source electrode layer, and the drain electrode layer; forming a first coil and a second coil over the third insulating layer; forming a fourth insulating layer over the third insulating layer, the first coil, and the second coil; and forming an antenna over the fourth insulating layer.

Another embodiment of the present invention is a method for manufacturing a semiconductor device including the steps of forming a first insulating layer over a substrate; forming a semiconductor layer over the first insulating layer; forming a gate insulating layer over the semiconductor layer; forming a gate electrode layer over the gate insulating layer; forming a second insulating layer over the gate electrode layer: forming a source electrode layer and a drain electrode layer which are in contact with the semiconductor layer and over the second insulating layer; forming a third insulating layer over the second insulating layer, the source electrode layer, and the drain electrode layer; forming a first coil over the third insulating layer; forming a fourth insulating layer over the third insulating layer and the first coil; forming a second coil over the fourth insulating layer; forming a fifth insulating layer over the fourth insulating layer and the second coil; and forming an antenna over the fifth insulating layer.

In the above structure, the first coil and the second coil may be formed using a conductive layer containing an element selected from aluminum, chromium, tantalum, titanium, molybdenum, tungsten, silver, copper, gold, platinum, nickel and palladium.

In the above structure, the semiconductor layer may be formed using an oxide semiconductor material.

In a semiconductor device (an RFID) according to one embodiment of the present invention, when a diode formed using a transistor is used for a rectifier circuit, degradation of the rectification efficiency due to the transistor can be reduced, and thus the rectification efficiency can be improved.

Further, since the antenna and a circuit portion can be formed over a same substrate, a manufacturing process can be simplified and a manufacturing cost can be reduced. Furthermore, since the antenna is formed directly on the same substrate as the circuit portion in a manufacturing process of the transistor, there is no interconnection to be formed by attaching the transistor and the antenna to each other in a later step, so that poor connection between the antenna and the circuit portion can be prevented.

BRIEF DESCRIPTION OF THE DRAWINGS

In the accompanying drawings.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

In addition, the semiconductor device (the RFID) according to one embodiment of the present invention can be applied to an RFID which does not have dependence on a frequency band for communication with a reader/writer and which is used for an arbitrary frequency band. Specifically, the RFID according to one embodiment of the present invention can be applied to any of the cases of an HF band with a frequency of 3 MHz to 30 MHz (for example, 13.56 MHz), a UHF band with a frequency of 300 MHz to 3 GHz (for example, 433 MHz, 953 MHz, or 2.45 GHz), and a frequency of 135 kHz.

The semiconductor device (RFID) of one embodiment of the present invention includes, in its category, any of products capable of wirelessly communicating data, such as an RF tag, an ID tag, an IC tag, an IC chip, a wireless tag, and an electronic tag.

Note that the ordinal numbers such as "first", "second", and "third" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device (an RFID) using a rectifier circuit (RFID) will be described with reference to FIGS. 1A and 1B, and FIG. 2.

Figure 1A:
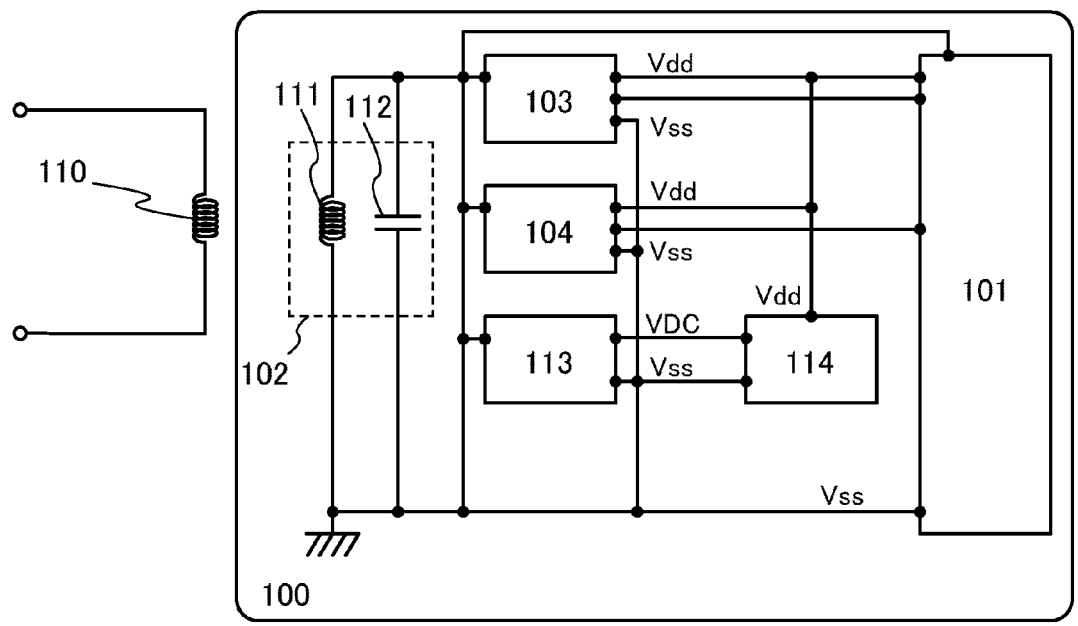
FIG. 1A is a block diagram illustrating a whole RFID according to one embodiment of the present invention and FIG. 1B is a block diagram illustrating a rectifier circuit according to one embodiment of the present invention.

FIG. 1A illustrates a block diagram of a whole RFID which is used as one embodiment of the present invention. An RFID 100 includes the following: a logic circuit 101 for performing functional processing such as generation of a response signal based on received data; an antenna circuit 102 for transmitting and receiving (communicating) a signal to/from a reader/writer; a demodulation circuit 103 for demodulating an amplitude modulation wave (generated by superimposing a modulation wave on a carrier wave) which is received via the antenna circuit 102 and for extracting a pulse signal; a modulation circuit 104 for modulating a carrier wave outputted from the reader/writer in accordance with a response signal outputted from the logic circuit 101 and for transmitting a response signal to the reader/writer; a rectifier circuit 113 for generating DC voltage from the carrier wave or the amplitude modulation wave which is received via the antenna circuit 102; and a constant voltage circuit 114 for obtaining a constant potential by stabilizing the DC voltage $V_{DC}$ that varies depending on the level of power.

Note that an antenna 110 is an antenna at a reader/writer side.

The antenna circuit 102 includes an antenna 111 and a resonant capacitor 112. The capability of receiving a carrier wave from the reader/writer varies depending on the shape, the number of windings or the like of the antenna 111; however, there is no particular limitation on the shape, the number of windings or the like of the antenna 111 in the present invention. The resonant capacitor 112 is a capacitor provided to optimize the resonance frequency of the antenna circuit 102 to the frequency of the carrier wave from the reader/writer by being combined with the antenna 111. Note that although the resonant capacitor 112 is provided in this embodiment, it is not necessarily provided, and in the case where the resonant capacitor 112 is not provided, the frequency of the carrier wave from the reader/writer may be optimized only with the antenna 111.

The rectifier circuit 113 has a function of rectifying a carrier wave or an amplitude modulation wave which is received via the antenna circuit 102 and generating DC voltage $V_{DC}$. The potential of a DC voltage $V_{DC}$ generated by the rectifier circuit 113 changes depending on the voltage amplitude of the carrier wave or the amplitude modulation wave. When the voltage amplitude is high, the DC voltage $V_{DC}$ also becomes high, and when the power is low, the DC voltage $V_{DC}$ also becomes low.

Figure 1B:
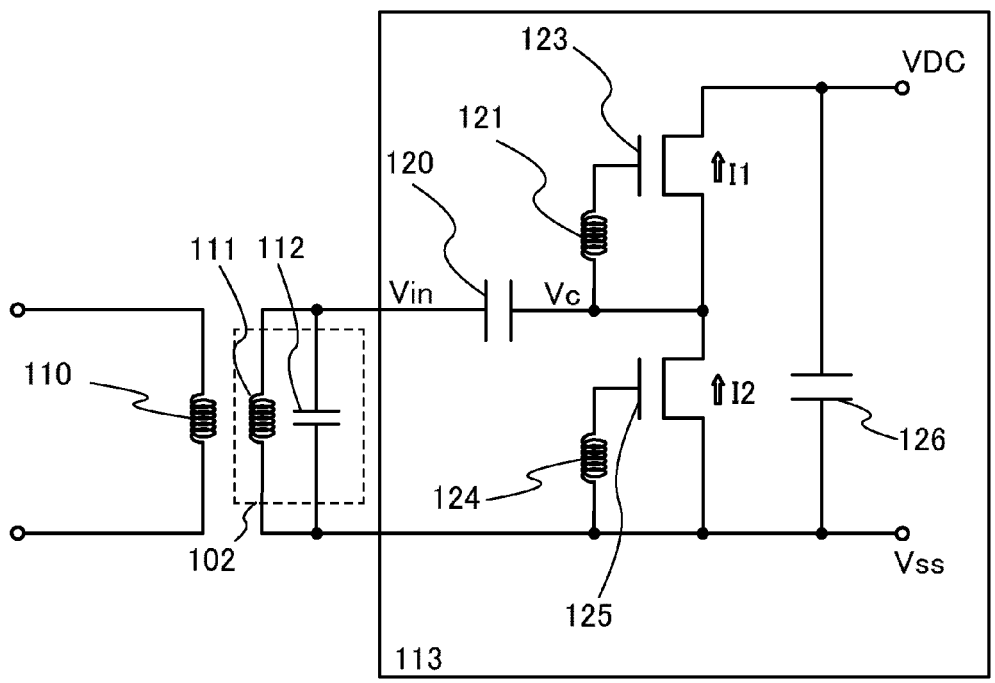

Next, details of the rectifier circuit 113 are illustrated in FIG. 1B. The rectifier circuit 113 includes a first coil 121, a second coil 124, a first capacitor 120, a second capacitor 126, a first transistor 123, and a second transistor 125. The first coil 121 is connected between a gate terminal of the first transistor 123 and a drain terminal thereof. The second coil 124 is connected between a gate terminal of the second transistor 125 and a drain terminal thereof.

Note that in the circuit diagram of FIG. 1B, the antenna 111, the first coil 121, and the second coil 124 are provided separately over a plane surface. However, the antenna 111, the first coil 121, and the second coil 124 are actually provided so that the first coil 121 and the second coil 124 at least partially overlap with the antenna, whereby the carrier wave or the amplitude modulation wave received via the antenna circuit 102 is rectified taking advantage of electromagnetic coupling between the antenna 111 and the first coil 121, and between the antenna 111 and the second coil 124.

Thus, current flowing through the first transistor 123 is amplified by the first coil 121 and current flowing through the second transistor 125 is amplified by the second coil 124, when compared to a configuration where the first coil 121 and the second coil 124 are not provided. Accordingly, as compared to a conventional diode including only a transistor, the rectification efficiency can be improved by the DC voltage $V_{DC}$ which is boosted by the first coil 121 and the second coil 124.

Next, the operation of the rectifier circuit 113 will be described. Since an antenna is a balanced device, a sine wave with a certain frequency is input to each of the two terminals of the antenna in an RFID. A signal at one terminal of the antenna and a signal at the other terminal of the antenna have phases shifted from each other by 180°. However, description is given below on the assumption that the potential of the other terminal of the antenna is fixed (0 V) for the sake of simplicity.

The first capacitor 120, the first transistor 123, and the second transistor 125 form a half-wave voltage doubler rectifier circuit. The first capacitor 120 has a function of shifting the amplitude voltage of a carrier wave or an amplitude modulation wave which is an AC signal to a positive side by using the low power supply potential (VSS) as a reference. A carrier wave or an amplitude modulation wave from the reader/writer which is received via the antenna 111 is amplified by electromagnetic coupling between the antenna 111 and the first coil 121 and between the antennal 111 and the second coil 124. After that, the carrier wave or the amplitude modulation wave which is amplified is rectified to (converted into) the DC voltage $V_{DC}$ by a diode including the first transistor 123 and the second transistor 125. The DC voltage $V_{DC}$ is held by accumulation of charge in the second capacitor 126. The generation of the DC voltage $V_{DC}$ makes it possible to ensure power supply of the circuits such as the constant voltage circuit and the logic circuit which are provided in the following stage of the rectifier circuit, so that the circuits can operate.

Note that although a diode-connected transistor is described in this embodiment, there is no particular limitation on the kind of the diode, and a PN diode, a PIN diode, a Schottky barrier diode, a constant voltage diode (a zener diode), or the like can be used.

Further in this embodiment, an n-channel transistor in which a gate and one of a source and a drain are diode-connected can be used. Alternatively, a p-channel transistor in which a gate and one of a source and a drain are diode-connected can be used. Although a transistor group including two diode-connected transistors in series is used in this embodiment, this embodiment is not limited thereto and two or more transistors may be connected in series. In the case of using a PN diode or a PIN diode, a lateral junction PN diode or a lateral junction PIN diode is preferably used. This is because a lateral junction PN diode or a lateral junction PIN diode can be manufactured over the same substrate as transistors necessary for a semiconductor device such as an RFID without changing the existing process.

Next, operation of the constant voltage circuit 114 will be described. The constant voltage circuit 114 has a function of converting a DC voltage $V_{DC}$ that changes depending on the power into a constant power supply potential Vdd (also referred to as a high power supply potential) and supplying the Vdd to the logic circuit 101. The logic circuit 101 operates unstably when a potential supplied to the logic circuit 101 changes; therefore, a constant potential needs to be supplied to the logic circuit 101. In this embodiment, the constant voltage circuit 114 supplies a constant power supply potential Vdd to the logic circuit 101. Note that the low power supply potential (hereinafter, referred to as $V_{SS}$) is common to each circuit in the RFID 100, and for example, the $V_{SS}$ can be set to GND (=0 V).

Note that the configuration of the RFID 100 illustrated in FIG. 1A is a structure in the case where the carrier wave or the amplitude modulation wave which is received via the antenna 111 is processed as appropriate with a circuit included in the logic circuit 101 and a clock signal CLK which is necessary for the operation of the logic circuit 101 is generated. When the clock signal CLK which is necessary for the operation of the logic circuit 101 is generated without referring to the carrier wave or the amplitude modulation wave which is received via the antenna 111, a configuration in which a clock generation circuit is additionally provided in the RFID 100 may be employed. In particular, in a remote RFID for performing communication with a reader/writer with a frequency of 300 MHz to 3 GHz (a UHF band), a configuration in which the clock generation circuit is additionally provided is preferable.

Figure 2:
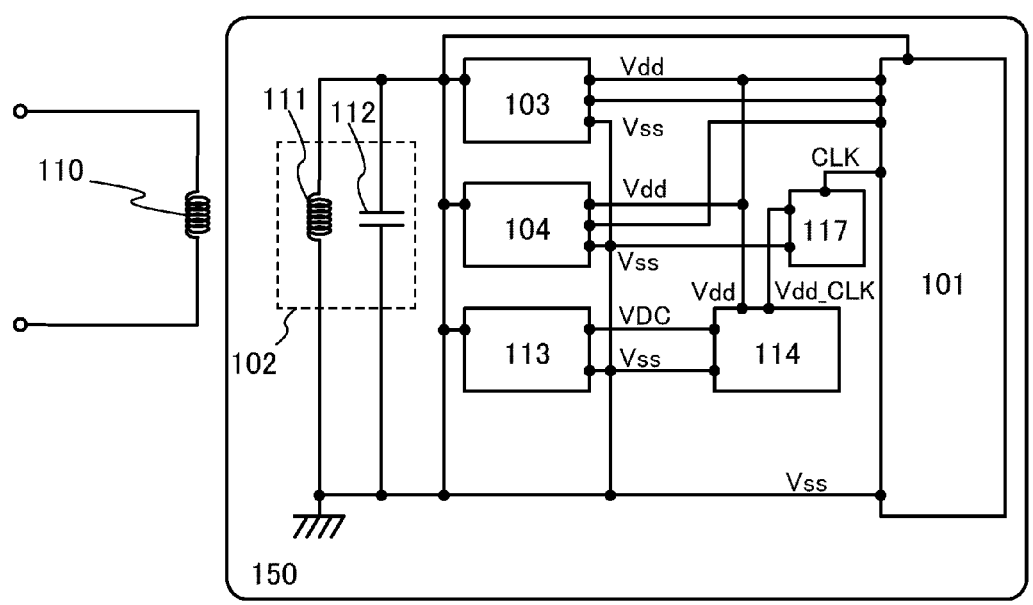
FIG. 2 is a block diagram illustrating a whole RFID according to one embodiment of the present invention.

FIG. 2 is a block diagram of a whole RFID 150 including a clock generation circuit.

A clock generation circuit 117 needs to have a function of stably supplying a clock signal CLK having a constant frequency to the logic circuit 101. Therefore, similarly to the logic circuit 101 described above, a constant potential needs to be supplied to the clock generation circuit 117.

As a constant potential supplied to the clock generation circuit 117, the power supply potential Vdd generated by the constant voltage circuit 114 may be used as in the logic circuit 101. However, the power supply potential Vdd is also supplied to other circuits and it may change depending on the operation of the other circuits. In that case, it is preferable that another power supply potential Vdd_CLK different from the power supply potential Vdd supplied to the other circuits be generated by the constant voltage circuit 114 and the power supply potential Vdd_CLK be supplied to the clock generation circuit 117. By employing this configuration, the clock generation circuit 117 can easily and stably supply a clock signal CLK having a constant frequency to the logic circuit 101.

Note that in the RFID 150 illustrated in FIG. 2, the circuits other than the clock generation circuit 117 can be similar to those in the RFID 100 illustrated in FIG. 1A and the transistors having the coils which are used for the rectifier circuit 113 can also be similar to the transistors in the rectifier circuit 113 in FIG. 1B; thus, description is omitted here.

By the circuit configuration described above, the RFID 150 can be formed.

As described above, in this embodiment, the first coil and the second coil are connected between the gates and the drains of the transistors included in the rectifier circuit, whereby the carrier wave or the amplitude modulation wave which is received via the antenna can be amplified using electromagnetic coupling between the antenna and the first coil and between the antennal and the second coil.

Accordingly, even if the loss of voltage/current which corresponds to a characteristic threshold value of a transistor is generated, the rectification efficiency of the carrier wave or the amplitude modulation wave received via the antenna in the rectifier circuit which includes a diode using a transistor is improved by providing the first coil and the second coil, whereby a semiconductor device (an RFID) having the rectifier circuit which generates a stable power can be provided.

This embodiment can be implemented in appropriate combination with the structures described in the other embodiments.

Embodiment 2

In this embodiment, a method for manufacturing a semiconductor device (an RFID) described in Embodiment 1 will be described with reference to FIGS. 3A to 3F, FIGS. 4A to 4C, FIGS. 5A to 5C, FIGS. 6A to 6C, and FIG. 7. In the structures described below, the same portions or portions having similar functions are denoted by the same reference numerals in different drawings, and the description thereof will not be repeated.

Figure 3A:
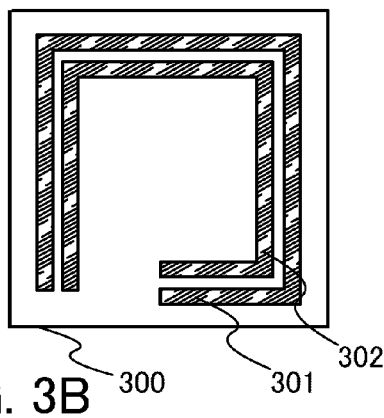
FIGS. 3A to 3F are plan views illustrating examples of an RFID according to one embodiment of the present invention.
Figure 3B:
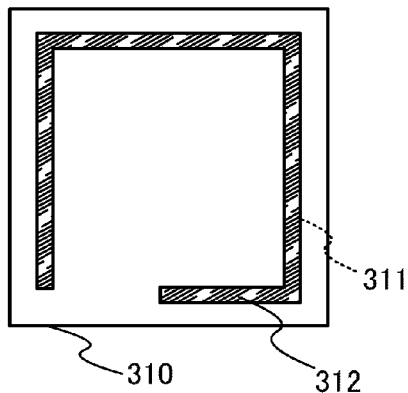
Figure 3C:
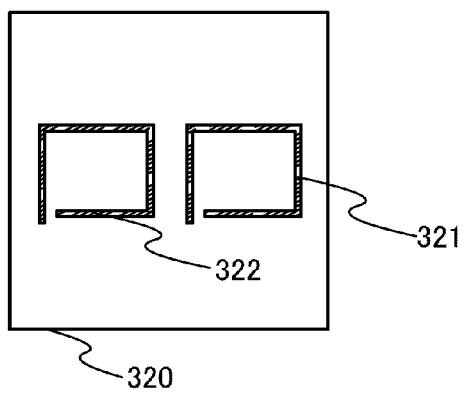
Figure 3D:
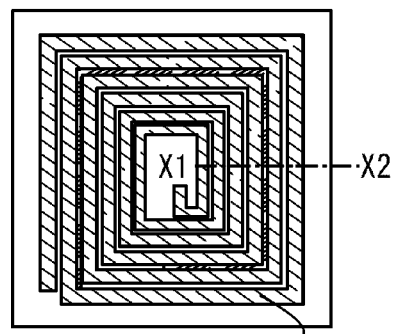
Figure 3E:
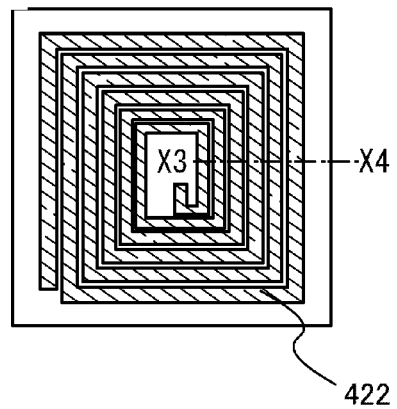
Figure 3F:
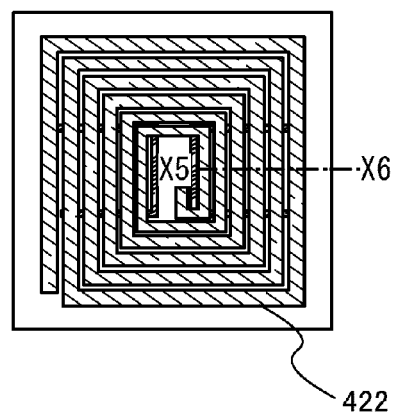

FIGS. 3A to 3F are plan views of semiconductor devices (RFIDs). FIGS. 3A to 3C are plan views before formation of an antenna, and FIGS. 3D to 3F are plan views after formation of the antenna, corresponding to FIGS. 3A to 3C, respectively. Semiconductor devices illustrated in FIGS. 3A to 3C have the same structure except that arrangement of the first coil and the second coil is different. Note that in the plan views of the semiconductor devices (RFIDs), the circuit portions and the like are not illustrated to avoid complexity.

A semiconductor device 300, a semiconductor device 310, and a semiconductor device 320 each illustrate an external shape of an RFID, and antennas 422 are each an antenna for receiving a carrier wave or an amplitude modulation wave.

FIG. 3A illustrates a first coil 301 and a second coil 302. The second coil 302 is provided on an inner side of the first coil 301. In FIG. 3B, a second coil 312 is provided above a first coil 311 (not illustrated because it overlaps with the second coil 312). In FIG. 3C, a first coil 321 and a second coil 322 are provided to be adjacent to each other over a plane surface.

As illustrated in FIGS. 3A to 3C, there is no particular limitation on arrangement of the first coil and the second coil provided for the transistors in the rectifier circuit as long as electromagnetic coupling is obtained between the antenna and the first coil and between the antenna and the second coil. Note that as illustrated in FIG. 3B, the first coil and the second coil have the same shape as the outermost perimeter of the antenna 422, whereby electromagnetic coupling between the antenna 422 and the first coil and between the antenna 422 and the second coil can be increased, which is preferable.

Further, in this embodiment, the first coil and the second coil have one winding (including a reversed C shape which is not completely wound or a shape based on the reversed C shape) over a plane surface. However, there is no particular limitation on the number of windings of the first coil and the second coil, and the first coil and the second coil may have a plurality of windings. Increase in the number of windings of the coil can increase voltage generated between two terminals of the coil, which is preferable.

Figure 4A:
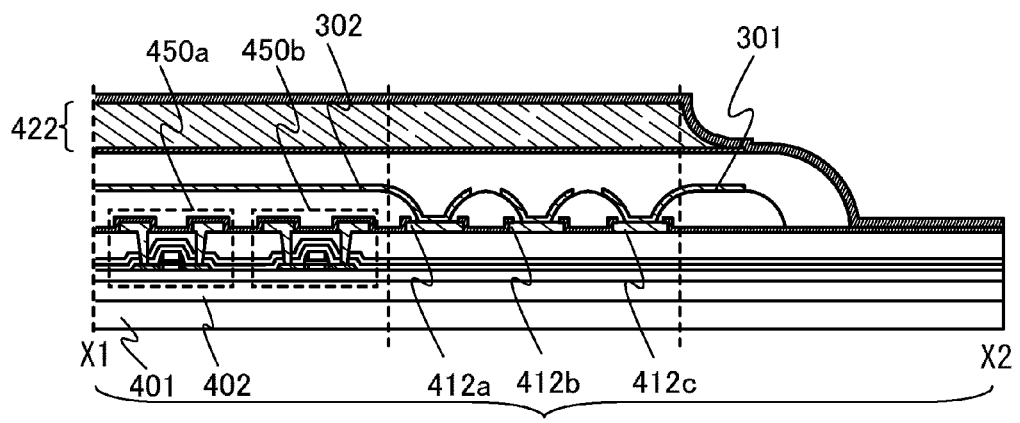
FIGS. 4A to 4C are cross-sectional views each illustrating an example of an RFID according to one embodiment of the present invention.
Figure 4B:
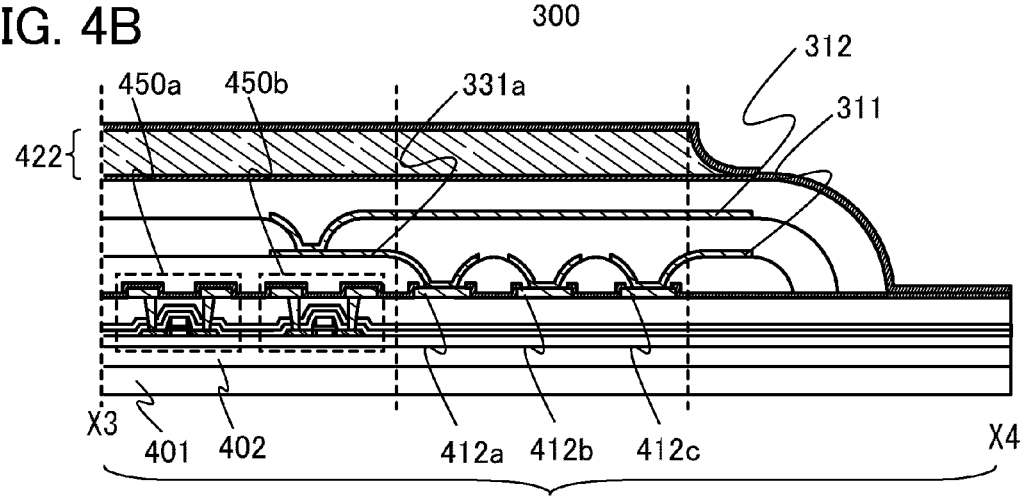
Figure 4C:
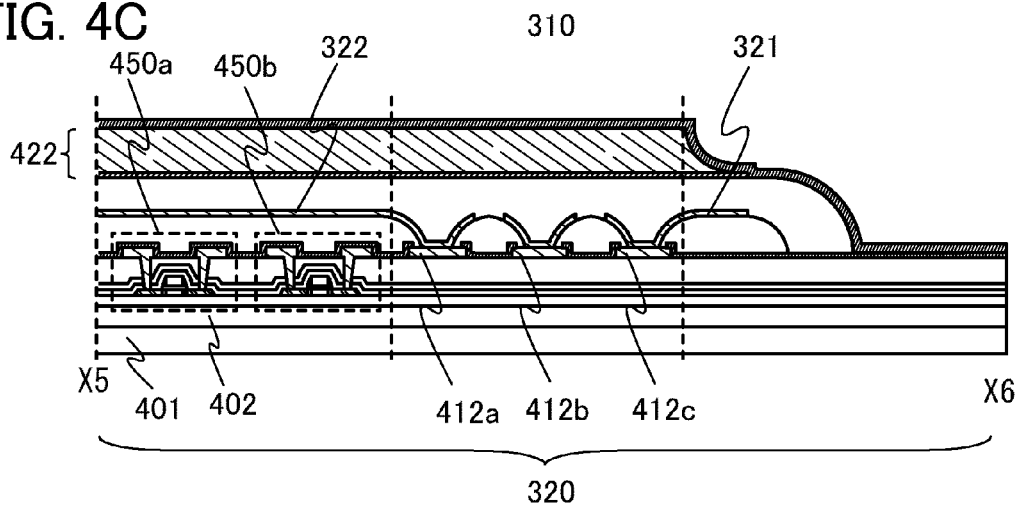

Next, FIGS. 4A to 4C are cross-sectional views illustrating the semiconductor devices (the RFIDs) illustrated in FIGS. 3D to 3F, respectively. FIG. 4A, FIG. 4B, and FIG. 4C are cross sectional views take along dash line X1-X2 of FIG. 3D, dash line X3-X4 of FIG. 3E, and dash line X5-X6 of FIG. 3F, respectively.

The semiconductor device 300 illustrated in FIG. 4A according to this embodiment includes a first insulating layer 402 over a substrate 401 and an integrated circuit over the first insulating layer 402. The integrated circuit includes a transistor 450a and a transistor 450b. Further, the transistor 450a is electrically connected to the antenna 422 and the second coil 302. The transistor 450b is electrically connected to the antenna 422 and the first coil 301.

The first coil 301 is connected to a gate electrode and a drain electrode of the transistor 450b through a connection electrode layer 412c and provided below the antenna 422. The second coil 302 is connected to a gate electrode and a drain electrode of the transistor 450a through a connection electrode layer 412a and provided below the antenna 422 and inside the first coil 301.

The semiconductor device 310 illustrated in FIG. 4B according to this embodiment includes a first insulating layer 402 over a substrate 401 and an integrated circuit over the first insulating layer 402. The integrated circuit includes the transistor 450a and the transistor 450b. Further, the transistor 450a is electrically connected to the antenna 422 and the second coil 312. The transistor 450b is electrically connected to the antenna 422 and the first coil 311.

The first coil 311 is connected to the gate electrode and the drain electrode of the transistor 450b through the connection electrode layer 412c. The second coil 312 is connected to the gate electrode and the drain electrode of the transistor 450a through a connection electrode layer 331a and the connection electrode layer 412a and provided above the first coil 311. Provision of the second coil 312 above the first coil 311 enables integration. Further, the first coil 311 and the second coil 312 have the same shape as the outermost perimeter of the antenna 422, whereby electromagnetic coupling between the antenna 422 and the first coil and between the antennal 422 and the second coil is increased, which is preferable.

The semiconductor device 320 illustrated in FIG. 4C according to this embodiment includes the first insulating layer 402 over the substrate 401 and an integrated circuit over the first insulating layer 402. The integrated circuit includes the transistor 450a and the transistor 450b. Further, the transistor 450a is electrically connected to the antenna 422 and the second coil 322. The transistor 450b is electrically connected to the antenna 422 and the first coil 321.

The first coil 321 is connected to the gate electrode and the drain electrode of the transistor 450b through the connection electrode layer 412c. The second coil 322 is connected to the gate electrode and the drain electrode of the transistor 450a through the connection electrode layer 412a.

In this embodiment, the first coil and the second coil are formed with the connection electrode layer formed therebetween. However, the first coil and the second coil can also be formed in a step of forming a gate electrode layer and a source or drain electrode layer illustrated in each of FIGS. 4A to 4C. In this case, the first coil and the second coil are formed using the same layer as the other circuits; therefore, the first coil and the second coil needs to be provided in consideration of the transistors or a circuit configuration.

As described above, in this embodiment, the first coil and the second coil are provided below the antenna, and the first coil and the second coil are connected between the gates and the drains of the transistors included in the rectifier circuit, whereby the carrier wave or the amplitude modulation wave received via the antenna can be amplified using electromagnetic coupling between the antenna and the first coil and between the antennal and the second coil.

Accordingly, even if the loss of voltage/current which corresponds to the characteristic threshold value of the transistor is generated, the rectification efficiency of the carrier wave or the amplitude modulation wave received via the antenna in the rectifier circuit which includes a diode using a transistor is improved by providing the first coil and the second coil, whereby a semiconductor device (an RFID) having the rectifier circuit which generates a stable power can be provided.

Here, an example of a manufacturing method of the semiconductor device 300 illustrated in FIG. 4A will be described in detail with reference to FIGS. 5A to 5C, FIGS. 6A to 6C, and FIG. 7. In the structures described below, the same portions or portions having similar functions are denoted by the same reference numerals in different drawings, and the description thereof will not be repeated. The semiconductor device 320 illustrated in FIG. 4C differs from the semiconductor device 300 illustrated in FIG. 4A only in the arrangement of the first coils and the second coils; therefore, the description of the manufacturing method of the semiconductor device 320 illustrated in FIG. 4C is omitted.

Figure 5A:
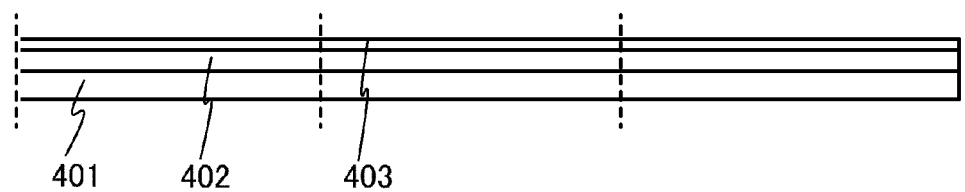
FIGS. 5A to 5C are cross-sectional views illustrating an example of an RFID according to one embodiment of the present invention.
Figure 5B:
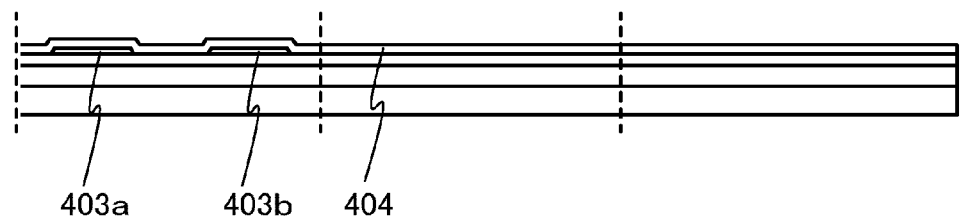

First, the first insulating layer 402 and a semiconductor layer 403 (e.g., a film containing amorphous silicon) are formed over a surface of the substrate 401 (see FIG. 5A). The first insulating layer 402 and the semiconductor layer 403 can be formed in immediate succession. Being formed in immediate succession so as not being exposed to the air, entry of an impurity can be prevented.

The substrate 401 may be a glass substrate, a quartz substrate, a sapphire substrate, a ceramic substrate, a metal substrate, or the like. Alternatively, a plastic substrate having sufficient heat resistance to the processing temperature of this embodiment may be used. In the manufacturing process of a semiconductor device, a formation substrate can be selected as appropriate in accordance with the process.

In the case where a glass substrate is used and the temperature at which the heat treatment is to be performed later is high, a glass substrate whose strain point is higher than or equal to 730° C. is preferably used. As a glass substrate, a glass material such as aluminosilicate glass, aluminoborosilicate glass, or barium borosilicate glass is used, for example. Note that by containing a large amount of barium oxide (BaO), a glass substrate which is heat-resistant and more practical can be obtained. Alternatively, crystallized glass or the like may be used.

The first insulating layer 402 has a function of preventing diffusion of an impurity element from the substrate 401, and can be formed with a single-layer structure or a stacked-layer structure using one or more of a silicon nitride film, a silicon oxide film, a silicon nitride oxide film, and a silicon oxynitride film.

Although a method in which the first insulating layer 402 and the semiconductor layer 403 are formed directly over the substrate 401 is described in this embodiment, a separation layer formed using tungsten or the like can be formed between the substrate 401 and the first insulating layer 402 and the semiconductor device (the RFID) can be separated from the substrate 401 to be transferred to a flexible substrate or the like.

The semiconductor layer 403 can be formed by a sputtering method, an LPCVD method, a plasma CVD method, or the like. In this embodiment, an amorphous silicon film is formed to have a thickness of 66 nm by a plasma CVD method. Note that when an amorphous silicon film is used for a semiconductor layer, the amorphous silicon film is formed to have a thickness of greater than or equal to 25 nm and less than or equal to 300 nm, preferably greater than or equal to 50 nm and less than or equal to 70 nm.

Next, the semiconductor layer 403 is irradiated with laser light to be crystallized. Note that the semiconductor layer 403 may be crystallized by combining laser light irradiation and thermal crystallization using RTA or an annealing furnace, thermal crystallization using a metal element that promotes crystallization, or the like. After that, the obtained crystalline semiconductor film is etched into a desired shape, whereby a semiconductor layer 403a and a semiconductor layer 403b are formed. Then, a gate insulating layer 404 is formed to cover the semiconductor layers 403a and 403b (see FIG. 5B).

An example of a manufacturing process of the semiconductor layers 403a and 403b is briefly described below. First, an amorphous semiconductor film (e.g., an amorphous silicon film) is formed by a plasma CVD method. Next, a solution containing nickel that is a metal element for promoting crystallization is retained on the amorphous semiconductor film, and a dehydrogenation treatment (at 500° C., for one hour) and a thermal crystallization treatment (at 550° C., for four hours) are performed on the amorphous semiconductor film, thereby forming a crystalline semiconductor film. Then, the crystalline semiconductor film is irradiated with laser light from a laser as needed, depending on the degree of crystallization, and the semiconductor layers 403a and 403b are formed by a photolithography method. Note that the thermal crystallization using a metal element that promotes crystallization is not necessarily performed and the amorphous semiconductor film may be crystallized only by laser light irradiation Alternatively, to obtain the semiconductor layers 403a and 403b, the semiconductor layer can be crystallized by being scanned in one direction while irradiating the semiconductor layer with continuous wave laser light or laser light that oscillates at a frequency higher than or equal to 10 MHz. In the case of performing such crystallization, crystals grow in the laser light scanning direction. A transistor may be provided so that its channel length direction (the direction in which carriers flow when a channel formation region is formed) is aligned with the scanning direction.

Next, the gate insulating layer 404 is formed so as to cover the semiconductor layers 403a and 403b. The gate insulating layer 404 is formed to have a single-layer structure or a stacked-layer structure of a film containing oxide of silicon or nitride of silicon by a plasma CVD method, a sputtering method, or the like. Specifically, the gate insulating layer 404 is formed to have a single-layer structure or a stacked-layer structure of a silicon oxide film, a silicon oxynitride film, or a silicon nitride oxide film.

Alternatively, the gate insulating layer 404 may be formed by oxidizing or nitridizing the surfaces of the semiconductor layers 403a and 403b by plasma treatment. For example, the gate insulating layer 705 is formed by plasma treatment with a mixed gas of a rare gas such as He, Ar, Kr, or Xe, and oxygen, nitrogen dioxide ($NO_2$), ammonia, nitrogen, hydrogen, or the like. In that case, plasma is excited by microwaves, so that plasma with a low electron temperature and a high density can be generated. With oxygen radicals (which may include OH radicals in some cases) or nitrogen radicals (which may include NH radicals in some cases) generated by such high-density plasma, the surfaces of the semiconductor layers can be oxidized or nitridized.

By treatment with such high-density plasma, an insulating film having a thickness of approximately greater than or equal to 1 nm and less than or equal to 20 nm, typically greater than or equal to 5 nm and less than or equal to 10 nm, is formed over the semiconductor layers. Since the reaction in this case is a solid-phase reaction, the interface state density between the insulating layer and the semiconductor layers can be made extremely low. The semiconductor layers (crystalline silicon or polycrystalline silicon) are directly oxidized (or nitridized) by such plasma treatment, whereby variation in thickness of the formed insulating layer can be considerably reduced. In addition, oxidation does not proceed even at the crystal grain boundaries of crystalline silicon, which makes a very preferable condition. That is, by the solid-phase oxidation of the surfaces of the semiconductor layers with the high-density plasma treatment described here, an insulating layer with good uniformity and low-interface state density can be formed without abnormal oxidation reaction at crystal grain boundaries.

As the gate insulating layer 404, only an insulating layer formed by the plasma treatment may be used, or an insulating film formed using silicon oxide, silicon oxynitride, silicon nitride, or the like may be additionally deposited and stacked thereover by a CVD method using plasma or thermal reaction. In either case, a transistor is preferably formed to have a gate insulating film, which partly or entirely includes an insulating film formed by plasma treatment because characteristic variations can be reduced.

Further, in the case where the semiconductor layers 403a and 403b are formed by scanning the semiconductor layer in one direction while irradiating the semiconductor layer with continuous wave laser light or laser light that oscillates at a frequency of higher than or equal to 10 MHz to be crystallized, thin film transistors (TFTs) having small characteristic variations and high field effect mobility can be obtained by combining the gate insulating layer subjected to the plasma treatment.

Next, a conductive layer is formed over the gate insulating layer 404. In this embodiment, a conductive layer with a thickness of greater than or equal to 100 nm and less than or equal to 500 nm is formed. Examples of a material which can be used for the conductive layer include a material containing an element selected from aluminum, chromium, tantalum, titanium, molybdenum, tungsten, silver, copper, gold, platinum, nickel, palladium, or the like; an alloy material mainly including any of these elements; or a compound material mainly including any of these elements. In the case where the conductive layer has a stacked-layer structure, for example, it is possible to use a stacked-layer structure of a tantalum nitride film and a tungsten film, a stacked-layer structure of a tungsten nitride film and a tungsten film, or a stacked-layer structure of a molybdenum nitride film and a molybdenum film. For example, a stacked-layer structure of a tantalum nitride film having a thickness of 30 nm and a tungsten film having a thickness of 150 nm can be used. Since tungsten or tantalum nitride has high heat resistance, heat treatment aimed at thermal activation can be performed after forming the conductive layer. Further, the conductive layer may have a stacked-layer structure of three or more layers, and for example, a stacked-layer structure of a molybdenum film, an aluminum film, and a molybdenum film may be used.

Figure 5C:
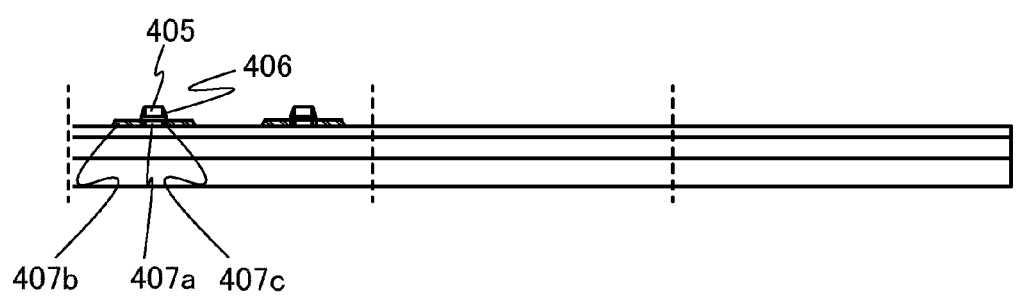

Next, a resist mask is formed over the conductive layer by a photolithography method, and etching treatment for forming a gate electrode and a gate wiring is performed, so that a gate electrode layer 405 is formed over the semiconductor layers 403a and 403b (see FIG. 5C).

Next, a resist mask is formed by a photolithography method and an impurity element imparting n-type or p-type conductivity is added to the semiconductor layers 403a and 403b at a low concentration by an ion doping method or an ion implantation method. In this embodiment, an impurity element imparting n-type conductivity is added to the semiconductor layers 403a and 403b at a low concentration. As the impurity element imparting n-type conductivity, an element belonging to Group 15, for example, phosphorus (P) or arsenic (As) can be used. As an impurity element imparting p-type conductivity, an element belonging to Group 13, for example, boron (B) can be used.

In this embodiment, only n-type TFTs are used; however, the present invention is not interpreted as being limited thereto. Alternatively, only p-type TFTs may be used. Still alternatively, n-type TFTs and p-type TFTs may be formed in combination. In the case where n-type TFTs and p-type TFTs are formed in combination, an impurity element imparting n-type conductivity is added in a state where a mask covering semiconductor layers that are to be included in p-type TFTs is formed, and an impurity element imparting p-type conductivity is added in a state where a mask covering semiconductor layers that are to be included in n-type TFTs is formed, whereby the impurity element imparting n-type conductivity and the impurity element imparting p-type conductivity can be selectively added.

Next, a protective insulating layer is formed so as to cover the gate insulating layer 404 and the gate electrode layer 405. The protective insulating layer is formed to have a single-layer structure or a stacked-layer structure of a film containing an inorganic material such as silicon, oxide of silicon, or nitride of silicon, or a film containing an organic material such as an organic resin, which is formed by a plasma CVD method, a sputtering method, or the like. Next, the protective insulating layer is selectively etched by anisotropic etching mainly in a vertical direction, whereby protective insulating layers 406 (also referred to as side walls) which are in contact with the side surfaces of the gate electrode layer 405 are formed. The protective insulating layers 406 are used as masks when an impurity element is added later for forming LDD (Lightly Doped Drain) regions.

Next, by using the resist mask formed by a photolithography method and the gate electrode layer 405 and the protective insulating layers 406 as masks, an impurity element imparting n-type conductivity is added to the semiconductor layers 403a and 403b. As a result, channel formation regions 407a, first impurity regions 407b, and second impurity regions 407c are formed (see FIG. 5C). The first impurity regions 407b serve as source and drain regions of the thin film transistor, and the second impurity regions 407c serve as LDD regions. The concentration of the impurity element contained in the second impurity regions 407c is lower than that of the impurity element contained in the first impurity regions 407b.

Then, a second insulating layer having a single-layer structure or a stacked-layer structure is formed so as to cover the gate electrode layer 405, the protective insulating layers 406, and the like. In this embodiment, the second insulating layer has a three-layer structure of an insulating layer 408, an insulating layer 409, and an insulating layer 410 (see FIG. 6A). A silicon oxynitride film having a thickness of 50 nm, a silicon nitride oxide film having a thickness of 200 nm, and a silicon oxynitride film having a thickness of 400 nm can be formed as the insulating layer 408, the insulating layer 409, and the insulating layer 410, respectively, by plasma CVD method. Surfaces of these insulating layers are, although depending on the thicknesses, formed parallel to the surface of the layer provided therebelow. That is, since the insulating layer 408 has a small thickness, the surface of the insulating film 408 closely conforms to the surfaces of the gate electrode layer 405 and the protective insulating layer 406. As the thickness of the insulating layer is larger, its surface becomes planar; therefore, the surface of the insulating layer 410 whose thickness is the largest of the three layers is almost planar. However, unlike an organic material, the insulating layer 410 made of silicon oxynitride does not have a planar surface shape. That is, if it is desired that the surface of the insulating layer 410 be planar, an organic material such as polyimide, polyamide, benzocyclobutene, acrylic, or epoxy; a siloxane material; or the like may be used. These insulating layers (the insulating layers 408, 409, and 410) can be formed by a sputtering method, an SOG method, a droplet discharge method, a screen printing method, or the like in addition to a plasma CVD method.

The insulating layers 408, 409, and 410, and the like are etched by a photolithography method to form opening portions reaching the first impurity regions 407b, and subsequently, a source electrode layer 411a, a drain electrode layer 411b, a source electrode layer 411c, and a drain electrode layer 411d which serve as a source electrode and a drain electrode of thin film transistors, and the connection electrode layers 412a, 412b, and 412c are formed.

The source electrode layer 411a, the drain electrode layer 411b, the source electrode layer 411c, and the drain electrode layer 411d can be formed in such a manner that a conductive layer is formed so as to fill the opening portions and the conductive layer is selectively etched. Note that before the conductive layer is formed, a silicide may be formed over the surfaces of the first impurity regions 407b that are exposed in the opening portions, so that the resistance between the impurity regions 407b and the corresponding electrode layers can be reduced.

The source electrode layer 411a, the drain electrode layer 411b, the source electrode layer 411c, and the drain electrode layer 411d are preferably formed using a low-resistance material because signal delay does not occur. Since a low-resistance material often has low heat resistance, a high heat resistance material is preferably provided over and below the low-resistance material. For example, a structure is preferable in which a film of aluminum, which is a low-resistance material, is formed with a thickness of 300 nm and a film of titanium with a thickness of 100 nm is formed over and below the aluminum film. Further, the connection electrode layer 412a, the connection electrode layer 412b, and the connection electrode layer 412c each serving as a connection electrode layer are formed from the same stacked-layer structure as the source electrode layer 411a, the drain electrode layer 411b, the source electrode layer 411c, and the drain electrode layer 411d, whereby the resistance of the connection electrode layers can be reduced and the heat resistance thereof can be improved.

The source electrode layer 411a, the drain electrode layer 411b, the source electrode layer 411c, the drain electrode layer 411d, the connection electrode layer 412a, the connection electrode layer 412b, and the connection electrode layer 412c can be formed to have a single-layer structure or a stacked-layer structure using another conductive material including an element selected from aluminum, chromium, tantalum, titanium, molybdenum, tungsten, silver, copper, gold, platinum, nickel, and palladium; an alloy material mainly including any of these elements; or a compound material mainly including any of these elements. Further, the source electrode layer 411a, the drain electrode layer 411b, the source electrode layer 411c, the drain electrode layer 411d, the connection electrode layer 412a, the connection electrode layer 412b, and the connection electrode layer 412c can be formed by a sputtering method or the like.

Figure 6A:
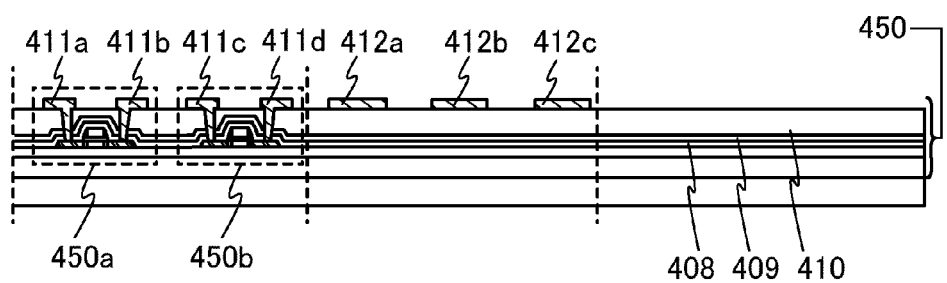
FIGS. 6A to 6C are cross-sectional views illustrating an example of an RFID according to one embodiment of the present invention.

Through the above steps, an element layer 450 including the transistor 450a and the transistor 450b can be obtained (see FIG. 6A).

Note that heat treatment for repairing crystallinity of the semiconductor layer 403a and the semiconductor layer 403b, activating the impurity element which is added to the semiconductor layer 403a and the semiconductor layer 403b, and hydrogenating the semiconductor layer 403a and the semiconductor layer 403b may be performed before the insulating layers 408, 409, and 410 are formed; after the insulating layer 408 is formed; or after the insulating layers 409 and 410 are formed. The heat treatment may be performed by thermal annealing, laser annealing, RTA, or the like.

Figure 6B:
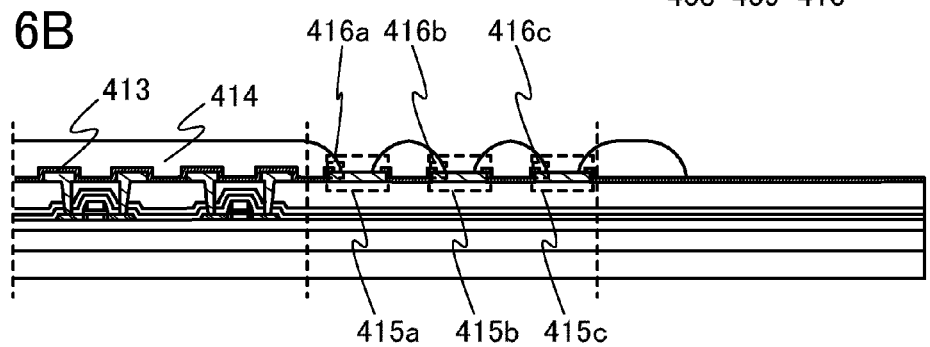
Figure 6C:
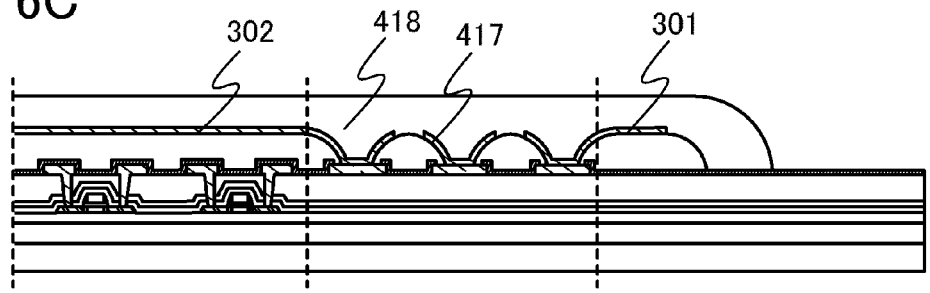

Next, an inorganic insulating layer 413 and a third insulating layer 414 are formed so as to cover the source electrode layer 411a, the drain electrode layer 411b, the source electrode layer 411c, the drain electrode layer 411d, the connection electrode layer 412a, the connection electrode layer 412b, and the connection electrode layer 412c (see FIG. 6B). In this embodiment, a silicon nitride film having a thickness of 100 nm is used for the inorganic insulating layer 413 and a polyimide film having a thickness of 1500 nm is used for the third insulating layer 414. It is preferable that a surface of the third insulating layer 414 have high planarity. Accordingly, the planarity of the third insulating layer 414 is improved by making the film have a large thickness of, for example, greater than or equal to 750 nm and less than or equal to 3000 nm, in addition to utilizing the characteristics of polyimide, which is an organic material. In addition, opening portions are formed in the inorganic insulating layer 413 and the third insulating layer 414. This embodiment describes a case where an opening portion 415a, an opening portion 415b, and an opening portion 415c are formed so as to expose the connection electrode layer 412a, the connection electrode layer 412b, and the connection electrode layer 412c. In such opening portions 415a, 415b, and 415c (specifically, a region 416a, a region 416b, and a region 416c surrounded by a dotted line), an end portion of the inorganic insulating layer 413 is covered with the third insulating layer 414. The end portion of the inorganic insulating layer 413 which is a lower layer is covered with the third insulating layer 414 which is an upper layer, whereby disconnection of wirings to be formed later in the opening portions 415a, 415b, and 415c can be prevented. Accordingly, in this embodiment, since the third insulating layer 414 is formed using polyimide which is an organic material, the third insulating layer 414 can have a gently tapered shape in the opening portions 415a, 415b, and 415c, and thus disconnection can be efficiently prevented. As a material for the third insulating layer 414 with which such an effect of preventing disconnection can be obtained, an organic material such as polyamide, benzocyclobutene, acrylic, or epoxy; a siloxane material; or the like can be given in addition to polyimide. Further, for the inorganic insulating layer 413, a silicon oxynitride film or a silicon nitride oxide film may be used instead of the silicon nitride film. The inorganic insulating layer 413 and the third insulating layer 414 can be manufactured by a plasma CVD method, a sputtering method, an SOG method, a droplet discharge method, a screen printing method, or the like.

Next, the first coil 301, the second coil 302, and the connection electrode layer 417 are formed over the inorganic insulating layer 413, the third insulating layer 414, the connection electrode layer 412a, the connection electrode layer 412b, and the connection electrode layer 412c. A fourth insulating layer 418 is formed over the first coil 301, the second coil 302, and the connection electrode layer 417 (see FIG. 6C). The first coil 301, the second coil 302, and the connection electrode layer 417 can be formed using the same material as the source electrode layer 411a, the drain electrode layer 411b, the source electrode layer 411c, the drain electrode layer 411d, the connection electrode layer 412a, the connection electrode layer 412b, and the connection electrode layer 412c; for example, a stacked-layer structure of a titanium film having a thickness of 100 nm, an aluminum film having a thickness of 200 nm, and a titanium film having a thickness of 100 nm can be employed. Further, since the first coil 301 is connected to the connection electrode layer 412c in the opening portion 415c, and the second coil 302 is connected to the connection electrode layer 412a in the opening portion 415a, titanium of the coils and titanium of the connection electrode layers are in contact with each other, whereby contact resistance can be suppressed.

In addition, since the connection electrode layer 417 is electrically connected to the transistor 450a and an antenna (formed later), it is preferable that the wiring resistance be low. Therefore, a low-resistance material such as aluminum is preferably used.

Note that the shapes of the first coil 301 and the second coil 302 can be changed as appropriate in accordance with embodiments as illustrated in FIGS. 3A to 3C.

The fourth insulating layer 418 needs to have a planar surface; therefore, the fourth insulating layer 418 is preferably formed using an organic material. Here, the case where a polyimide film having a thickness of 2000 nm is used for the fourth insulating layer 418 is described as an example. The fourth insulating layer 418 is formed to have a thickness of 2000 nm, which is larger than the thickness of the third insulating layer 414, because projections and depressions formed by the surfaces of the first coil 301, the second coil 302, and the connection electrode layer 417 which are formed in the opening portion 415a, the opening portion 415b, and the opening portion 415c in the third insulating layer 414 having a thickness of 1500 nm should be planarized. Therefore, the fourth insulating layer 418 preferably has a thickness 1.1 to 2 times, preferably, 1.2 to 1.5 times as large as the thickness of the third insulating layer 414, and when the third insulating layer 414 has a thickness of greater than or equal to 750 nm and less than or equal to 3000 nm, the fourth insulating layer 418 preferably has a thickness of greater than or equal to 900 nm and less than or equal to 4500 nm. The fourth insulating layer 418 is preferably formed using a material with which planarity can be improved in consideration of the thickness of the fourth insulating layer 418. As a material for the fourth insulating layer 418 with which the planarity can be improved, an organic material such as polyamide, benzocyclobutene, acrylic, or epoxy; a siloxane material; or the like can be given in addition to polyimide. In the case where the antenna is formed over the fourth insulating layer 418, as described above, the planarity of the surface of the fourth insulating layer 418 should be taken into consideration.

Figure 7:
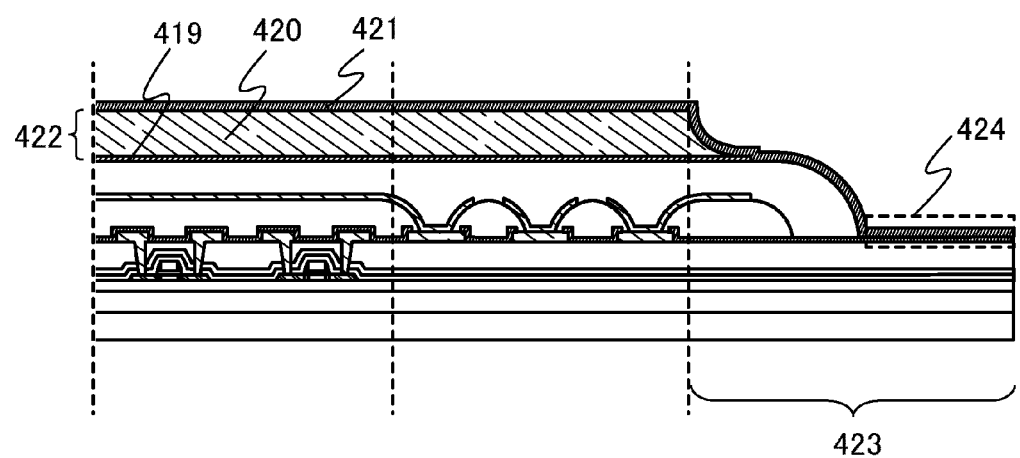
FIG. 7 is a cross-sectional view illustrating an example of an RFID according to one embodiment of the present invention.

Next, the antenna 422 is formed over the fourth insulating layer 418 (see FIG. 7). Then, the antenna 422 and the source electrode layer 411a are connected to each other through an opening portion (not illustrated). The opening portion is formed below the antenna 422 in order to achieve integration. Note that although the antenna 422 may be directly connected to the source electrode layer 411a, provision of the connection electrode layer 417 as in this embodiment is preferable because a margin can be secured for formation of the opening portion for connection with the antenna 422, and high integration can be achieved. Therefore, a conductive layer may be further provided over the connection electrode layer 417 to be connected to the antenna 422. That is, it is acceptable as long as the antenna 422 is electrically connected to the source electrode layer 411a included in the transistor, and high integration can be achieved with a connection structure through a plurality of conductive layers. When the thicknesses of the plurality of conductive layers such as the connection electrode layer 417 are large, the semiconductor device is also thickened; therefore, the thicknesses of the plurality of conductive layers are preferably small. Therefore, the thickness of the connection electrode layer 417 or the like is preferably smaller than that of the source electrode layer 411a.

The antenna 422 can employ a stacked-layer structure of a first conductive layer 419 and a second conductive layer 420. In this embodiment, the case where a stacked-layer structure is formed by using a titanium layer having a thickness of 100 nm for the first conductive layer 419 and an aluminum layer having a thickness of 2000 nm for the second conductive layer 420 is described. Titanium used for the first conductive layer 419 can increase moisture resistance of the antenna, and can increase adhesion between the fourth insulating layer 418 and the antenna 422. In addition, titanium can reduce contact resistance between the first conductive layer 419 and the connection electrode layer 417. This is because the titanium film formed as the uppermost layer of the connection electrode layer 417, and the titanium film of the antenna, which are in contact with each other, are both formed using titanium. Such a titanium film is patterned by dry etching, and accordingly, an end portion thereof tends to have a steep angle. Aluminum used for the second conductive layer 420 is a low-electrical resistance material, so it is suitable for the antenna 422. The resistance can be further reduced by forming a thicker aluminum film. Resistance of the antenna 422 is preferably lowered because this can increase a communication distance. Such an aluminum film is formed by wet etching, so a side surface of the end portion tends to have a tapered shape. The tapered shape in this embodiment is a shape whose side surface curves toward the inside of the aluminum, that is, a shape having a curved recessed side surface. Since the end portion of the titanium is projected from the end portion of the aluminum, disconnection of an insulating layer formed later can be prevented, and further, the durability of the antenna 422 can be increased.

The antenna 422 can be formed by a sputtering method, a printing method such as screen printing or gravure printing, a droplet discharge method, a dispenser method, a plating method, or the like. As a conductive material for the antenna 422, it is possible to use, in addition to titanium and aluminum, a material containing a metal element such as aluminum, chromium, tantalum, titanium, molybdenum, tungsten, silver, copper, gold, platinum, nickel, or palladium, an alloy material containing any of these metal elements, or a compound material containing any of these metal elements. Although a stacked-layer structure is described as an example in this embodiment, a single-layer structure of any of the above materials may be employed.

Next, an inorganic insulating layer 421 is formed so as to cover the antenna 422. In this embodiment, a silicon nitride film having a thickness of 200 nm is used for the inorganic insulating layer 421. Provision of the inorganic insulating layer 421 can further increase the moisture resistance of the antenna 422, which is preferable. Since the end portion of the titanium is projected from the end portion of the aluminum, the inorganic insulating layer 421 can be formed without disconnection. The inorganic insulating layer 421 as described above can be formed using a silicon oxynitride film, a silicon nitride oxide film, or another inorganic material in addition to the silicon nitride film.

A periphery portion 423 is illustrated as an example of a periphery portion of the semiconductor device. The inorganic insulating layer 421 and the inorganic insulating layer 413 are preferably in contact with each other outside the inorganic insulating layer 421, that is, outside the antenna in the circuit portion (specifically, in a region 424). In this embodiment, both of the inorganic insulating layers 421 and 413 are silicon nitride films, so that the parts formed from the same material are closely in contact with each other; thus, the adhesion is high and entry of moisture and oxygen from the outside can be effectively prevented.

Through the above steps, the semiconductor device 300 in which the first coil and the second coil are connected between the gates and the drains of the transistors included in the rectifier circuit, as illustrated in FIG. 4A, can be manufactured.

Accordingly, even if the loss of voltage/current which corresponds to the characteristic threshold value of the transistor is generated, the rectification efficiency of the carrier wave or the amplitude modulation wave which is received via the antenna in the rectifier circuit which includes a diode using a transistor is improved by providing the first coil and the second coil, whereby a semiconductor device (an RFID) having the rectifier circuit which generates a stable power can be provided.

This embodiment can be implemented in combination with any of the structures described in the other embodiments as appropriate.

Embodiment 3

Figure 8A:
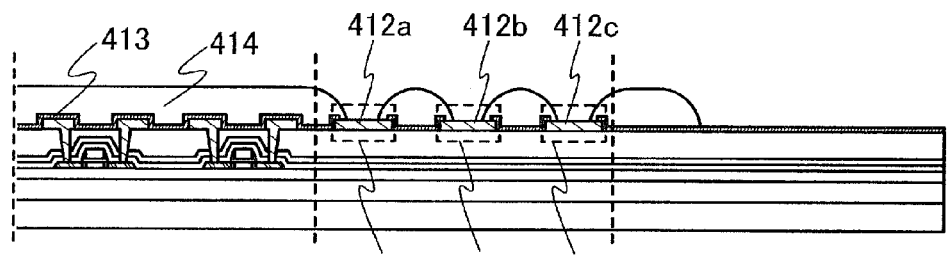
FIGS. 8A to 8C are cross-sectional views illustrating an example of an RFID according to one embodiment of the present invention.
Figure 8B:
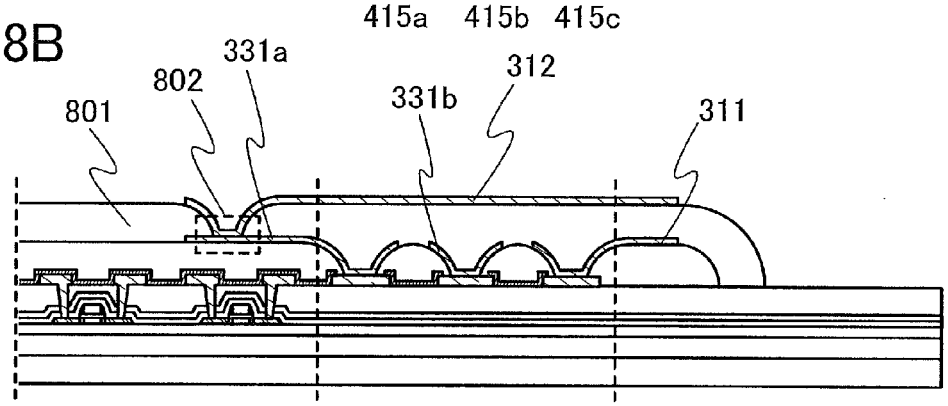

In this embodiment, an example of a method for manufacturing the semiconductor device (the RFID) illustrated in FIG. 4B in Embodiment 2 will be described in detail with reference to FIGS. 8A to 8C and FIG. 9. In the structures described below, the same portions or portions having similar functions are denoted by the same reference numerals in different drawings, and the description thereof will not be repeated. Further, the method for manufacturing the semiconductor device illustrated in FIG. 4B has many same steps as the method for manufacturing the semiconductor device 300 illustrated in FIG. 4A; therefore, the descriptions of the same manufacturing steps are simplified and partially omitted. Note that a cross-sectional view of FIG. 8A is the same as that of FIG. 6B, and the state illustrated in FIG. 8A is formed in accordance with the manufacturing method illustrated in FIGS. 5A to 5C and FIG. 6A.

The first coil 311, the connection electrode layer 331a, and a connection electrode layer 331b are formed over the inorganic insulating layer 413, the third insulating layer 414, the connection electrode layer 412a, the connection electrode layer 412b, and the connection electrode layer 412c. A fourth insulating layer 801 is formed over the first coil 311, the connection electrode layer 331a, and the connection electrode layer 331b. The second coil 312 is formed over the fourth insulating layer 801 (see FIG. 8B).

The first coil 311, the connection electrode layer 331a, and the connection electrode layer 331b can have a stacked-layer structure of a titanium film having a thickness of 100 nm, an aluminum film having a thickness of 200 nm, and a titanium film having a thickness of 100 nm. Further, since the first coil 311 is connected to the connection electrode layer 412c in the opening portion 415c, titanium of the coils and titanium of the connection electrode layers are in contact with each other, whereby contact resistance can be suppressed.

In addition, since the connection electrode layer 331b is electrically connected to the transistor 450a and an antenna (formed later), it is preferable that the wiring resistance be low. Therefore, a low-resistance material such as aluminum is preferably used.

Note that the shapes of the first coil 311 and the second coil 312 can be changed as appropriate in accordance with embodiments as illustrated in FIGS. 3A to 3C.

The fourth insulating layer 801 needs to have a planar surface; therefore, the fourth insulating layer 801 is preferably formed using an organic material. Here, the case where a 2000 nm polyimide film is used for the fourth insulating layer 801 is described as an example. The fourth insulating layer 801 is formed to have a thickness of 2000 nm, which is larger than the thickness of the third insulating film 414, because projections and depressions formed by the surfaces of the first coil 311, the connection electrode layer 331a, and the connection electrode layer 331b which are formed in the opening portion 415a, the opening portion 415b, and the opening portion 415c of the third insulating layer 414 having a thickness of 1500 nm should be planarized. Therefore, the fourth insulating layer 801 preferably has a thickness 1.1 to 2 times, preferably, 1.2 to 1.5 times as large as the thickness of the third insulating layer 414, and when the third insulating layer 414 has a thickness of greater than or equal to 750 nm and less than or equal to 3000 nm, the fourth insulating layer 801 preferably has a thickness of greater than or equal to 900 nm and less than or equal to 4500 nm. The fourth insulating layer 801 is preferably formed using a material with which planarity can be improved in consideration of the thickness of the fourth insulating layer 801. As a material for the fourth insulating layer 801 with which the planarity can be improved, an organic material such as polyamide, benzocyclobutene, acrylic, or epoxy; a siloxane material; or the like can be given in addition to polyimide.

The second coil 312 can have a stacked-layer structure of a titanium film having a thickness of 100 nm, an aluminum film having a thickness of 200 nm, and a titanium film having a thickness of 100 nm. Since the second coil 312 is connected to the connection electrode layer 331a in an opening portion 802, the second coil 312 and the connection electrode layer 331a formed using titanium are in contact with each other, whereby contact resistance can be suppressed.

Figure 8C:
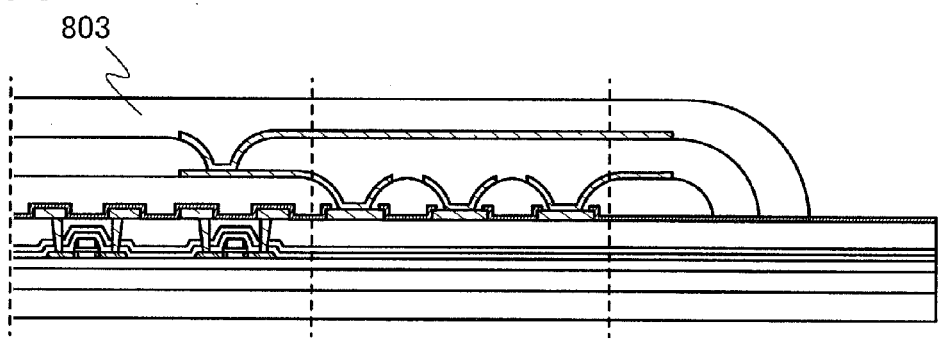

Next, a fifth insulating layer 803 is formed over the fourth insulating layer 801 and the second coil 312 (see FIG. 8C). The fifth insulating layer 803 needs to have a planar surface; therefore, the fifth insulating layer 803 is preferably formed using an organic material. Here, the case where a 3000 nm polyimide film is used for the fifth insulating layer 803 is described as an example. The fifth insulating layer 803 is formed to have a thickness of 3000 nm, which is larger than the thickness of the fourth insulating layer 801, because projections and depressions formed by the surface of the second coil 312 formed in the opening portion 802 of the fourth insulating layer 801 having a thickness of 2000 nm should be planarized. Therefore, the fifth insulating layer 803 preferably has a thickness 1.1 to 2 times, preferably, 1.2 to 1.5 times as large as the thickness of the fourth insulating layer 801, and when the fourth insulating layer 801 has a thickness of greater than or equal to 900 nm and less than or equal to 4500 nm, the fifth insulating layer 803 preferably has a thickness of greater than or equal to 1080 nm and less than or equal to 6750 nm. The fifth insulating layer 803 is preferably formed using a material with which planarity can be improved in consideration of the thickness of the fifth insulating layer 803. As a material for the fifth insulating layer 803 with which the planarity can be improved, an organic material such as polyamide, benzocyclobutene, acrylic, or epoxy; a siloxane material; or the like can be given in addition to polyimide. In the case where the antenna is formed over the fifth insulating layer 803, as described above, the planarity of the surface of the fifth insulating layer 803 should be taken into consideration.

Figure 9:
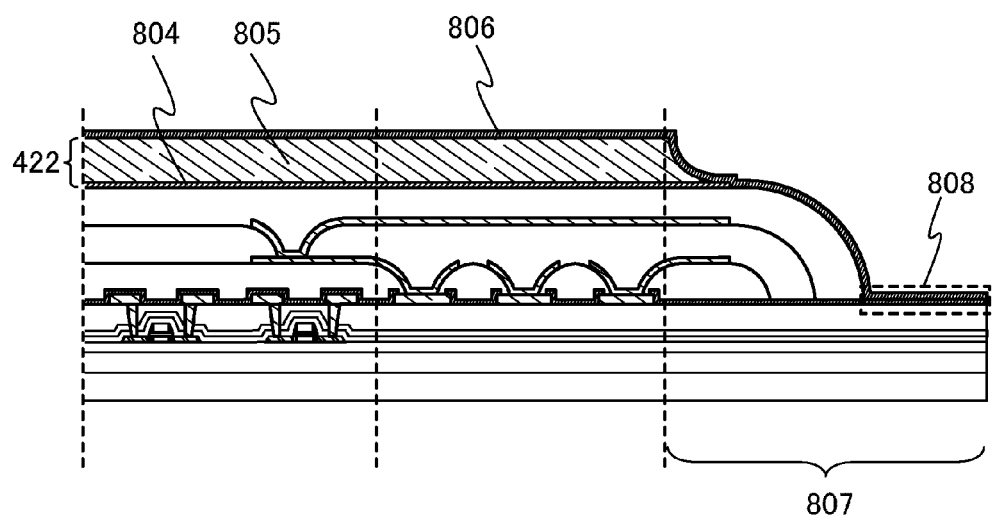
FIG. 9 is a cross-sectional view illustrating an example of an RFID according to one embodiment of the present invention.

Next, the antenna 422 is formed over the fifth insulating layer 803 (see FIG. 9). Then, the antenna 422 and the connection electrode layer 331*b* are connected to each other through an opening portion (not illustrated). The opening portion is formed below the antenna 422 to be integrated. Note that although the antenna 422 may be directly connected to the source electrode layer 411*a*, provision of the connection electrode layer 331*b* as in this embodiment is preferable because a margin can be secured for formation of the opening portion for connection with the antenna 422, and high integration can be achieved. That is, it is acceptable as long as the antenna 422 is electrically connected to the source electrode layer 411*a* included in the transistor, and high integration can be achieved with a connection structure through a plurality of conductive layers. When the thicknesses of the plurality of conductive layers such as the connection electrode layer 331*b* are large, the semiconductor device is also thickened; therefore, the thicknesses of the plurality of conductive layers are preferably small. Therefore, the thickness of the connection electrode layer 331*b* is preferably smaller than that of the source electrode layer 411*a*.

The antenna 422 can employ a stacked-layer structure of a first conductive layer 804 and a second conductive layer 805. In this embodiment, the case where a stacked-layer structure is formed by using a titanium layer having a thickness of 100 nm for the first conductive layer 804 and an aluminum layer having a thickness of 2000 nm for the second conductive layer 805 is described. Titanium used for the first conductive layer 804 can increase moisture resistance of the antenna, and can increase adhesion between the fifth insulating layer 803 and the antenna 422. In addition, contact resistance between the first conductive layer 804 and the connection electrode layer 331*b* can be reduced because the titanium film formed as the uppermost layer of the connection electrode layer 331*b* is in contact with the titanium in the antenna, that is, the same material is in contact with each other. Such a titanium film is formed by dry etching, and accordingly, an end portion thereof tends to have a steep angle. Aluminum used for the second conductive layer 805 is a low-resistance material, so it is suitable for the antenna. The resistance can be further reduced by forming the thick aluminum film. Resistance of the antenna is preferably lowered because a communication distance can be increased. Such an aluminum film is formed by wet etching, so a side surface of the end portion tends to have a tapered shape. The tapered shape in this embodiment is a shape whose side surface curves toward the inside of the aluminum, that is, a shape having a curved recessed side surface. Since the end portion of the titanium is projected from the end portion of the aluminum, disconnection of an insulating layer formed later can be prevented, and further, the durability of the antenna 422 can be increased.

The antenna 422 can be formed by a sputtering method, a printing method such as screen printing or gravure printing, a droplet discharge method, a dispenser method, a plating method, or the like. As a conductive material for the antenna 422, it is possible to use, in addition to titanium and aluminum, a material containing a metal element such as aluminum, chromium, tantalum, titanium, molybdenum, tungsten, silver, copper, gold, platinum, nickel, or palladium, an alloy material containing any of these metal elements, or a compound material containing any of these metal elements. Although a stacked-layer structure is described as an example in this embodiment, a single-layer structure of any of the above materials may be employed.

Next, an inorganic insulating layer 806 is formed so as to cover the antenna 422. In this embodiment, a silicon nitride film having a thickness of 200 nm is used for the inorganic insulating layer 806. Provision of the inorganic insulating layer 806 can further increase the moisture resistance of the antenna 422, which is preferable. Since the end portion of the titanium is projected from the end portion of the aluminum, the inorganic insulating layer 806 can be formed without disconnection. The inorganic insulating layer 806 as described above can be formed using a silicon oxynitride film, a silicon nitride oxide film, or another inorganic material in addition to the silicon nitride film.

A periphery portion 807 is illustrated as an example of a periphery portion of the semiconductor device. The inorganic insulating layer 806 and the inorganic insulating layer 413 are preferably in contact with each other outside the inorganic insulating layer 806, that is, outside the antenna in the circuit portion (specifically, in a region 808). In this embodiment, both of the inorganic insulating layers 806 and 413 are silicon nitride films, so that the parts formed from the same material are closely in contact with each other; thus, the adhesion is high and entry of moisture and oxygen from outside can be effectively prevented.

Through the above steps, the semiconductor device 310 illustrated in FIG. 4B can be manufactured in which the first coil 311 and the second coil 312 are connected between the gates and the drains of the transistors included in the rectifier circuit.

Accordingly, even if the loss of voltage/current which corresponds to the threshold value of the performance of a transistor is generated, the rectification efficiency of the carrier wave or the amplitude modulation wave which is received via the antenna in the rectifier circuit which includes a diode using a transistor is improved by providing the first coil and the second coil, whereby a semiconductor device (an RFID) having the rectifier circuit which generates a stable power can be provided.

This embodiment can be implemented in combination with any of the structures described in the other embodiments as appropriate.

Embodiment 4

An example of another material which can be used for the semiconductor layers of the transistors in Embodiments 1 to 3 will be described.

The semiconductor layer included in a semiconductor element can be formed using the following material: an amorphous semiconductor manufactured by a sputtering method or a vapor-phase growth method using a semiconductor material gas such as silane or germane; a polycrystalline semiconductor manufactured by crystallizing the amorphous semiconductor with the use of light energy or thermal energy; a microcrystalline semiconductor; or the like. The semiconductor layer can be formed by a sputtering method, an LPCVD method, a plasma CVD method, or the like.

The microcrystalline semiconductor film can be formed by a high-frequency plasma CVD apparatus with a frequency of several tens of MHz to several hundreds of MHz or a microwave plasma CVD apparatus with a frequency of 1 GHz or higher. Typically, the microcrystalline semiconductor film can be formed using silicon hydride such as $SiH_4$, $Si_2H_6$, $SiH_2Cl_2$, $SiHCl_3$, $SiCl_4$, or $SiF_4$, which is diluted with hydrogen. Further, with a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is 5:1 to 200:1, preferably 50:1 to 150:1, further preferably 100:1.

A typical example of an amorphous semiconductor is hydrogenated amorphous silicon, and a typical example of a crystalline semiconductor is polysilicon and the like. Polysilicon (polycrystalline silicon) includes so-called high-temperature polysilicon that contains polysilicon formed at a process temperature of higher than or equal to 800° C. as its main component, so-called low-temperature polysilicon that contains polysilicon formed at a process temperature of lower than or equal to 600° C. as its main component, polysilicon formed by crystallizing amorphous silicon by using an element that promotes crystallization, or the like, and the like. As described above, a microcrystalline semiconductor or a semiconductor partly including a crystalline phase can also be used.

In the case of using a crystalline semiconductor film for the semiconductor layer, the crystalline semiconductor film may be manufactured by various methods (e.g., laser crystallization, thermal crystallization, or thermal crystallization using an element that promotes crystallization, such as nickel). Alternatively, a microcrystalline semiconductor, which is an SAS (Semi Amorphous Semiconductor), may be crystallized by laser irradiation to increase crystallinity. In the case where an element that promotes crystallization is not introduced, an amorphous silicon film is heated at 500° C. for one hour in a nitrogen atmosphere before being irradiated with laser light, whereby hydrogen contained in the amorphous silicon film is released to allow its concentration to be lower than or equal to $1\times10^{20}$ atoms/cm$^3$. This is because, if the amorphous silicon film contains much hydrogen, the amorphous silicon film is broken by laser irradiation.

There is no particular limitation on a method for introducing the metal element into an amorphous semiconductor film as long as the metal element can exist on the surface of or inside the amorphous semiconductor film. For example, a sputtering method, a CVD method, a plasma process method (including a plasma CVD method), an adsorption method, a method of applying a solution of a metal salt, or the like can be used. Among them, the method using a solution is easy and advantageous in that the concentration of the metal element can be easily controlled. At this time, an oxide film is preferably formed on the surface of the amorphous semiconductor film by UV light irradiation in an oxygen atmosphere, thermal oxidation, treatment with ozone-containing water or hydrogen peroxide including a hydroxyl radical, or the like in order to improve its wettability and to spread the solution over the entire surface of the amorphous semiconductor film.

In the step of crystallizing the amorphous semiconductor film to form a crystalline semiconductor film, an element that promotes crystallization (also referred to as a catalytic element or a metal element) may be added to the amorphous semiconductor film and heat treatment (at 550° C. to 750° C. for 3 minutes to 24 hours) may be performed for crystallization. As the element that accelerates (promotes) crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor film containing a rare gas element is formed on the crystalline semiconductor film containing the element that promotes crystallization, and then heat treatment is performed (at 550° C. to 750° C. for 3 minutes to 24 hours). The element that promotes crystallization contained in the crystalline semiconductor film moves into the semiconductor film containing a rare gas element and is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed plural times.

A crystalline semiconductor film can also be formed directly over the substrate by a plasma method. Alternatively, a crystalline semiconductor film may be selectively formed over the substrate by a plasma method.

This embodiment can be implemented in appropriate combination with the structures described in the other embodiments.

Embodiment 5

In this embodiment, an example of a transistor in which an oxide semiconductor layer is used as another material which can be used for the semiconductor layer of the transistor described in Embodiments 1 to 4 will be described with reference to FIGS. 10A to 10D. There is no particular limitation on the structure of the transistor; for example, a staggered type or a planar type having a top-gate structure or a bottom-gate structure can be employed as appropriate. Further, the transistor may have any of a single gate structure including one channel formation region, a double gate structure including two channel formation regions, or a triple gate structure including three channel formation regions. Alternatively, the transistor may have a dual gate structure including two gate electrodes positioned over and below a channel region with a gate insulating layer provided therebetween. In the structures described below, the same portions or portions having similar functions are denoted by the same reference numerals in different drawings, and the description thereof will not be repeated.

FIGS. 10A to 10D each illustrate an example of a cross-sectional structure of a transistor. Transistors illustrated in FIGS. 10A to 10D are transistors including an oxide semiconductor as a semiconductor. An advantage of using an oxide semiconductor is that high mobility and a low off-state current can be obtained with an easy and low-temperature process.

Figure 10A:
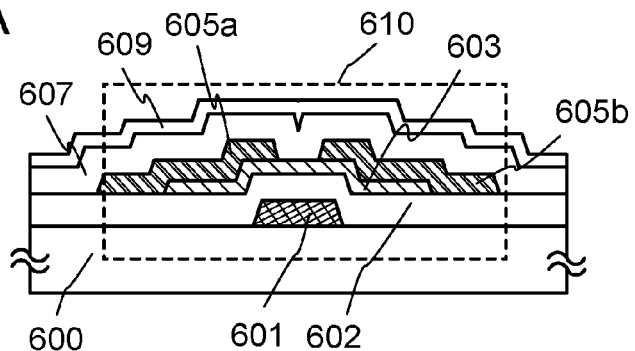
FIGS. 10A to 10D are cross-sectional views each illustrating an example of a transistor according to one embodiment of the present invention.

A transistor 610 illustrated in FIG. 10A is an example of bottom-gate transistors, and is also referred to as an inverted staggered transistor.

The transistor 610 includes, over a substrate 600 having an insulating surface, a gate electrode 601, a gate insulating layer 602, an oxide semiconductor layer 603, a source or drain electrode 605*a*, and a source or drain electrode 605*b*. Further, an insulating layer 607 being in contact with the oxide semiconductor layer 603 is provided so as to cover the transistor 610. Further, a protective insulating layer 609 is formed over the insulating layer 607.

Figure 10B:
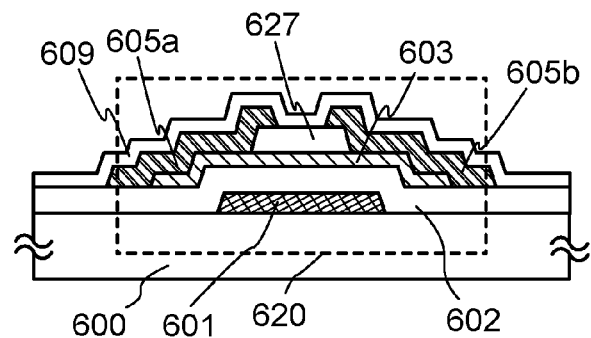

A transistor 620 illustrated in FIG. 10B is an example of bottom-gate transistors called channel-protective (channel-stop) transistors and is also called an inverted staggered transistor.

The transistor 620 includes, over the substrate 600 having an insulating surface, the gate electrode 601, the gate insulating layer 602, the oxide semiconductor layer 603, an insulating layer 627 which functions as a channel protective layer, the source or drain electrode 605*a*, and the source or drain electrode 605*b*. Further, the protective insulating layer 609 is formed so as to cover the transistor 620.

Figure 10C:
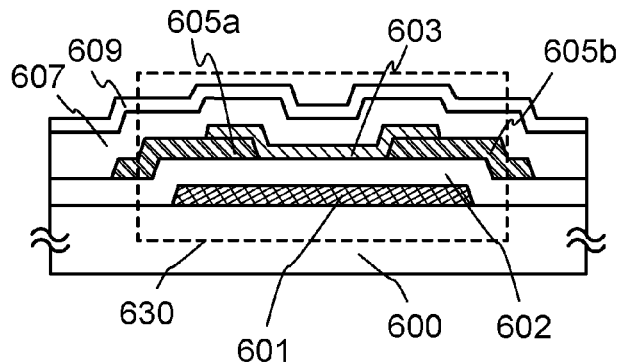

A transistor 630 illustrated in FIG. 10C is an example of bottom-gate transistors. The transistor 630 includes, over the substrate 600 having an insulating surface, the gate electrode 601, the gate insulating layer 602, the source or drain electrode 605*a*, the source or drain electrode 605*b*, and the oxide semiconductor layer 603. Further, the insulating layer 607 being in contact with the oxide semiconductor layer 603 is provided so as to cover the transistor 630. The protective insulating layer 609 is further formed over the insulating layer 607.

In the transistor 630, the gate insulating layer 602 is provided over and in contact with the substrate 600 and the gate electrode 601; the source or drain electrode 605*a* and the source or drain electrode 605*b* are provided over and in contact with the gate insulating layer 602. In addition, the oxide semiconductor layer 603 is provided over the gate insulating layer 602, the source or drain electrode 605*a*, and the source or drain electrode 605*b*.

Figure 10D:
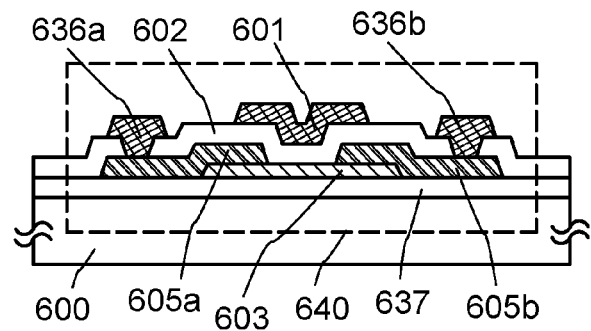

A transistor 640 illustrated in FIG. 10D is an example of top-gate transistors. The transistor 640 includes, over the substrate 600 having an insulating surface, an insulating layer 637, the oxide semiconductor layer 603, the source or drain electrode 605*a*, the source or drain electrode 605*b*, the gate insulating layer 602, and the gate electrode 601. A wiring 636*a* and a wiring 636*b* are provided in contact with the source or drain electrode 605*a* and the source or drain electrode 605*b*, respectively.

In this embodiment, the oxide semiconductor layer 603 is used as a semiconductor layer. As examples of an oxide semiconductor used for the oxide semiconductor layer 603, there are an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are two-component metal oxides; and an In—O-based oxide semiconductor, a Sn—O-based oxide semiconductor, and a Zn—O-based oxide semiconductor. Further, $SiO_2$ may be added to the above-described oxide semiconductor. Here, for example, an In—Ga—Zn—O-based oxide semiconductor is an oxide including at least In, Ga, and Zn, and there is no particular limitation on the composition ratio thereof. Further, the In—Ga—Zn—O-based oxide semiconductor may include an element other than In, Ga, and Zn.

For the oxide semiconductor layer 603, an oxide semiconductor represented by the chemical formula, $In MO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

In the transistor 610, the transistor 620, the transistor 630, and the transistor 640 which include the oxide semiconductor layer 603, leakage current can be significantly reduced. Thus, when any of these transistors is applied to a rectifier circuit, potential can be held for a longer time and the rectification efficiency of the rectifier circuit can be enhanced.

There is no particular limitation on the substrate that can be used as the substrate 600 having an insulating surface. For example, a glass substrate, a quartz substrate, or the like which is used in a liquid crystal display device or the like can be used. Alternatively, a substrate in which an insulating layer is formed over a silicon wafer, or the like may be used.

In the bottom-gate transistors 610, 620, and 630, an insulating layer serving as a base may be provided between the substrate and the gate electrode. The insulating layer has a function of preventing diffusion of an impurity element from the substrate, and can be formed of one or more of a silicon nitride film, a silicon oxide film, a silicon nitride oxide film, and a silicon oxynitride film.

The gate electrode 601 can be formed using a metal material such as molybdenum, titanium, chromium, tantalum, tungsten, aluminum, copper, neodymium, or scandium, or an alloy material which includes any of these metal materials as a main component. The gate electrode 601 may have either a single-layer structure or a stacked structure.

The gate insulating layer 602 can be formed of one or more of a silicon oxide film, a silicon nitride film, a silicon oxynitride film, a silicon nitride oxide film, an aluminum oxide film, an aluminum nitride film, an aluminum oxynitride film, an aluminum nitride oxide film, and a hafnium oxide film by a plasma CVD method, a sputtering method, or the like. For example, a gate insulating layer with a total thickness of about 500 nm can be formed in such a manner that a silicon nitride film ($SiN_y$ (y>0)) with a thickness of greater than or equal to 50 nm and less than or equal to 200 nm is formed as a first gate insulating layer by a plasma CVD method and a silicon oxide film ($SiO_x$ (x>0)) with a thickness of greater than or equal to 5 nm and less than or equal to 300 nm is stacked over the first gate insulating layer as a second gate insulating layer by a sputtering method.

The source or drain electrode 605*a* and the source or drain electrode 605*b* can be formed using a metal material such as molybdenum, titanium, chromium, tantalum, tungsten, aluminum, copper, neodymium, or scandium, or an alloy material which includes any of these metal materials as a main component. For example, the source or drain electrode 605*a* and the source or drain electrode 605*b* can have a stacked structure of a layer of metal such as aluminum, copper, or the like and a layer of high-melting-point metal such as titanium, molybdenum, or tungsten. An aluminum material to which an element which prevents generation of hillocks or whiskers (e.g., silicon, neodymium, or scandium) is added may be used for higher heat resistance.

Alternatively, the conductive film to be the source or drain electrode 605a and the source or drain electrode 605b (including a wiring formed in the same layer as the source or drain electrodes) may be a conductive metal oxide film. As a conductive metal oxide, indium oxide ($In_2O_3$), tin oxide ($SnO_2$), zinc oxide (ZnO), indium oxide-tin oxide alloy ($In_2O_3$—$SnO_2$, which is abbreviated as ITO in some cases), indium oxide-zinc oxide alloy ($In_2O_3$—ZnO), any of these metal oxide materials in which silicon oxide is contained, or the like can be used.

A material similar to that of the source or drain electrode 605a and the source or drain electrode 605b can be used for the wiring 636a and the wiring 636b which are in contact with the source or drain electrode 605a and the source or drain electrode 605b, respectively.

As the insulating layers 607, 627, and 637, an inorganic insulating film typified by a silicon oxide film, a silicon oxynitride film, a gallium oxide film, an aluminum oxide film, and an aluminum oxynitride film, can be used.

As the protective insulating layer 609, an inorganic insulating film such as a silicon nitride film, an aluminum nitride film, a silicon nitride oxide film, or an aluminum nitride oxide film can be used.

In addition, a planarization insulating film may be formed over the protective insulating layer 609 in order to reduce surface unevenness due to the transistor. As the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed of these materials.

The structures, methods, and the like described in this embodiment can be combined as appropriate with any of the structures, methods, and the like described in the other embodiments.

Embodiment 6

In this embodiment, an example of a method for manufacturing the transistor including the oxide semiconductor layer illustrated in FIG. 10A in Embodiment 5 will be described in detail with reference to FIGS. 11A to 11E.

FIGS. 11A to 11E are cross-sectional views illustrating a manufacturing process of a transistor. A transistor 510 illustrated here is an inverted staggered transistor. Note that a transistor 510 has the same structure as the transistor illustrated in FIG. 10A which is exemplified in Embodiment 5.

An oxide semiconductor used for a semiconductor layer of this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen which is an n-type impurity is removed from an oxide semiconductor, the oxide semiconductor is prevented from containing impurities which are not components of the oxide semiconductor as much as possible, and oxygen vacancies in the oxide semiconductor are filled, so that the oxide semiconductor is purified.

Note that the purified oxide semiconductor includes extremely few carriers, and the carrier concentration is lower than $1\times10^{14}/cm^3$, preferably lower than $1\times10^{12}/cm^3$, further preferably lower than $1\times10^{11}/cm^3$. Such few carriers enable a current in an off state (off-state current) to be particularly small.

Specifically, in the transistor including the above-described oxide semiconductor layer, the off-state current density per channel width of 1 µm at room temperature (25° C.) can be less than or equal to 100 zA/µm ($1\times10^{-19}$ A/µm), or further less than or equal to 10 zA/µm ($1\times10^{-20}$ A/µm).

In the transistor 510 including a highly-purified oxide semiconductor layer, temperature dependence of on-state current is hardly observed, and off-state current remains extremely low at a high temperature.

A process for manufacturing the transistor 510 over a substrate 505 will be described with reference to FIGS. 11A to 11E.

First, a conductive layer is formed over the substrate 505 having an insulating surface, and then a gate electrode 511 is formed through a first photolithography process. Note that a resist mask used in the photolithography process may be formed by an inkjet method. Formation of the resist mask by an inkjet method needs no photomask; thus, manufacturing cost can be reduced.

As the substrate 505 having an insulating surface, a substrate similar to the substrate 600 described in the above embodiment can be used. In this embodiment, a glass substrate is used as the substrate 505.

An insulating layer serving as a base may be provided between the substrate 505 and the gate electrode 511. The insulating layer has a function of preventing diffusion of an impurity element from the substrate 505, and can be formed of one or more films selected from a silicon nitride film, a silicon oxide film, a silicon nitride oxide film, a silicon oxynitride film, and the like.

The gate electrode 511 can be formed using a metal material such as molybdenum, titanium, chromium, tantalum, tungsten, aluminum, copper, neodymium, or scandium, or an alloy material which includes any of these metal materials as a main component. The gate electrode 511 can have a single-layer structure or a stacked structure.

Next, a gate insulating layer 507 is formed over the gate electrode 511. The gate insulating layer 507 can be formed by a plasma CVD method, a sputtering method, or the like. The gate insulating layer 507 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

Further, in order that hydrogen, a hydroxyl group, and moisture are contained as little as possible in the gate insulating layer 507 and an oxide semiconductor film 530, it is preferable to preheat the substrate 505 over which the gate electrode 511 is formed or the substrate 505 over which the gate electrode 511 and the gate insulating layer 507 are formed, in a preheating chamber of a sputtering apparatus as pretreatment for the formation of the oxide semiconductor film 530, so that impurities such as hydrogen and moisture adsorbed on the substrate 505 are desorbed. As an evacuation unit, a cryopump is preferably provided in the preheating chamber. Alternatively, this preheating step may be performed on the substrate 505 over which components up to and including a source or drain electrode 515a and a source or drain electrode 515b are formed. Note that this preheating treatment can be omitted.

Figure 11A:
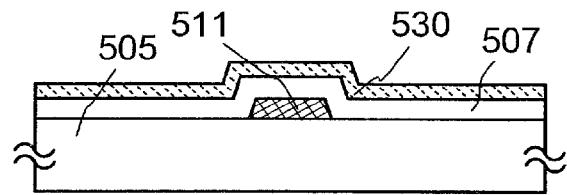
FIGS. 11A to 11E are cross-sectional views illustrating an example of a transistor according to one embodiment of the present invention.
Figure 11B:
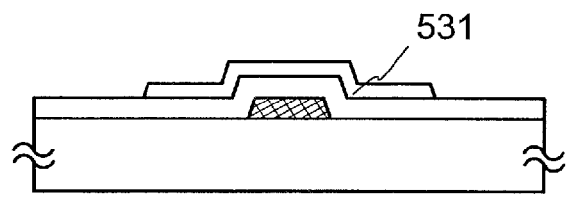

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 11A).

For the oxide semiconductor film 530, any of the four-component metal oxide, the three-component metal oxides, the two-component metal oxides, an In—O-based oxide semiconductor, a Sn—O-based oxide semiconductor, a Zn—O-based oxide semiconductor, and the like, which are described in Embodiment 5, can be used.

As a target for forming the oxide semiconductor film 530 by a sputtering method, a metal oxide target containing zinc oxide as its main component can be used. As another example of the metal oxide target, a metal oxide target including In, Ga, and Zn (with a composition ratio of $In_2O_3:Ga_2O_3:ZnO=1:1:1$ (molar ratio)) can be used. Alternatively, an oxide semiconductor target containing In, Ga, and Zn (the composition ratio of $In_2O_3:Ga_2O_3:ZnO=2:2:1$ or $1:1:4$ [molar ratio]) can be used. The filling rate of the metal oxide target is greater than or equal to 90% and less than or equal to 100%, preferably greater than or equal to 95% and less than or equal to 99.9%. With the use of a metal oxide target with high filling rate, the deposited oxide semiconductor film has high density.

The atmosphere in which the oxide semiconductor film 530 is formed is preferably a rare gas (typically, argon) atmosphere, an oxygen atmosphere, or a mixed atmosphere containing a rare gas (typically, argon) and oxygen. Specifically, it is preferable to use, for example, an atmosphere of a high-purity gas from which an impurity such as hydrogen, water, a hydroxyl group, or hydride is removed so that the concentration of the impurity is lower than or equal to 1 ppm (preferably the concentration is lower than or equal to 10 ppb).

In the formation of the oxide semiconductor film 530, for example, an object to be processed may be held in a treatment chamber that is kept under reduced pressure and the object to be processed may be heated so that the temperature of the object to be processed is higher than or equal to 100° C. and lower than 550° C., preferably higher than or equal to 200° C. and lower than or equal to 450° C. Alternatively, the temperature of the object to be processed in the formation of the oxide semiconductor film 530 may be room temperature (25° C.±10° C.). Then, a sputtering gas from which hydrogen, water, or the like is removed is introduced while moisture in the treatment chamber is removed, and the aforementioned target is used, whereby the oxide semiconductor film 530 is formed. In forming the oxide semiconductor film 530 while heating the object to be processed, impurities in the oxide semiconductor layer can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. By evacuation with the cryopump or the like, hydrogen, water, and the like can be removed from the treatment chamber, whereby the impurity concentration in the oxide semiconductor film 530 can be reduced.

The oxide semiconductor film 530 can be formed under the following conditions, for example: the distance between the object to be processed and the target is 170 mm, the pressure is 0.4 Pa, the direct-current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct-current (DC) power source is preferably used because dust (such as powder substances formed at the time of film formation) can be reduced and the film thickness can be uniform. The thickness of the oxide semiconductor film 530 is greater than or equal to 1 nm and less than or equal to 50 nm, preferably greater than or equal to 1 nm and less than or equal to 30 nm. With the oxide semiconductor film 530 having such a thickness, a short-channel effect due to miniaturization can be suppressed. Note that the appropriate thickness differs depending on the oxide semiconductor material to be used, the intended use of the semiconductor device, and the like; therefore, the thickness may be determined in accordance with the material, the intended use, and the like.

Note that before the oxide semiconductor film 530 is formed by a sputtering method, a substance attached to a surface where the oxide semiconductor film 530 is to be formed (e.g., a surface of the gate insulating layer 507) is preferably removed by reverse sputtering in which an argon gas is introduced to generate plasma. Here, reverse sputtering is a method by which ions collide with a surface to be processed so that the surface is modified. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Next, the oxide semiconductor film 530 is processed into an island-shaped oxide semiconductor layer through a second photolithography process. Note that a resist mask used in the photolithography process may be formed by an inkjet method. Formation of the resist mask by an inkjet method needs no photomask; thus, manufacturing cost can be reduced.

In the case where an opening portion is formed in the gate insulating layer 507, a step of forming the opening portion can be performed at the same time as processing of the oxide semiconductor film 530.

As the etching of the oxide semiconductor film 530, either wet etching or dry etching or both of them may be employed. As an etchant used for wet etching of the oxide semiconductor film 530, a solution obtained by mixing phosphoric acid, acetic acid, and nitric acid, an ammonia peroxide mixture (31 wt % hydrogen peroxide water:28 wt % ammonia water:water=5:2:2), or the like can be used. ITO07N (produced by KANTO CHEMICAL CO., INC.) may also be used.

Then, heat treatment (first heat treatment) is performed on the oxide semiconductor film, so that an oxide semiconductor layer 531 is formed (see FIG. 10B). By the first heat treatment, excessive hydrogen (including water and a hydroxyl group) in the oxide semiconductor layer is removed and a structure of the oxide semiconductor layer is improved, so that defect level in energy gap can be reduced. The temperature of the first heat treatment is, for example, higher than or equal to 300° C. and lower than 650° C., preferably higher than or equal to 400° C. and lower than or equal to 500° C.

The heat treatment can be performed in such a way that, for example, an object to be processed is introduced into an electric furnace in which a resistance heating element or the like is used and heated at 450° C. under a nitrogen atmosphere for an hour. During the heat treatment, the oxide semiconductor layer is not exposed to air, in order to prevent entry of water and hydrogen.

The heat treatment apparatus is not limited to an electric furnace; the heat treatment apparatus can be an apparatus that heats an object to be processed using thermal radiation or thermal conduction from a medium such as a heated gas or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed using radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA treatment may be performed in the following manner. The object to be processed is put in an inert gas atmosphere that has been heated, heated for several minutes, and then taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the process. This is because defect levels in the energy gap due to oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In any case, the oxide semiconductor layer in which impurities are reduced by the first heat treatment is formed, whereby a transistor with extremely excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can be performed after the formation of the oxide semiconductor film 530 and before the oxide semiconductor film 530 is processed into the island-shaped oxide semiconductor layer. Such dehydration treatment or dehydrogenation treatment may be conducted once or plural times.

The first heat treatment can be performed at any of the following timings other than the above timing: after formation of a source electrode and a drain electrode, after formation of an insulating layer over the source electrode and the drain electrode, and the like.

Next, a conductive film to be a source electrode and a drain electrode (including a wiring formed from the same film as the source electrode and the drain electrode) is formed over the gate insulating layer 507 and the oxide semiconductor layer 531. The conductive film used to form the source electrode and the drain electrode can be formed using any of the materials described in Embodiment 5.

Figure 11C:
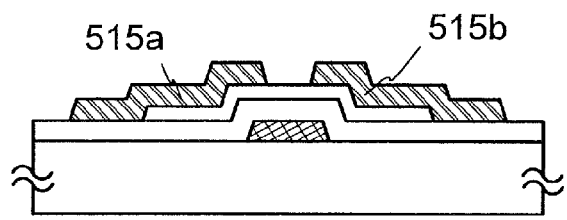

A resist mask is formed over the conductive film in a third photolithography process, and the source or drain electrode 515a and the source or drain electrode 515b are formed by selective etching, and then, the resist mask is removed (see FIG. 11C).

Light exposure at the time of formation of the resist mask in the third photolithography process may be performed using ultraviolet light, KrF laser light, or ArF laser light. Note that the channel length (L) of the transistor is determined by the distance between the source electrode and the drain electrode. Therefore, in light exposure for forming a mask which is used for forming a transistor with a channel length (L) of less than 25 nm, it is preferable to use extreme ultraviolet light whose wavelength is as short as several nanometers to several tens of nanometers. In light exposure using extreme ultraviolet light, resolution is high and depth of focus is large. For these reasons, the channel length (L) of the transistor completed later can be greater than or equal to 10 nm and less than or equal to 1000 nm (1 μm), and the circuit can operate at high speed. Moreover, power consumption of the semiconductor device can be reduced by miniaturization.

In order to reduce the number of photomasks and the number of photolithography processes, the etching step may be performed using a resist mask formed with a multi-tone mask. Since a resist mask formed with a multi-tone mask includes regions of plural thicknesses and can be further changed in shape by performing etching, the resist mask can be used in a plurality of etching steps to provide different patterns. Therefore, a resist mask corresponding to at least two kinds or more of different patterns can be formed with one multi-tone mask. Thus, the number of light-exposure masks can be reduced and the number of corresponding photolithography processes can also be reduced, whereby simplification of the process can be realized.

Note that it is preferable that etching conditions be optimized so as not to etch and divide the oxide semiconductor layer 531 when the conductive film is etched. However, it is difficult to obtain etching conditions in which only the conductive film is etched and the oxide semiconductor layer 531 is not etched at all. In some cases, part of the oxide semiconductor layer 531 is etched when the conductive film is etched, whereby the oxide semiconductor layer 531 having a groove portion (a recessed portion) is formed.

Either wet etching or dry etching may be used for the etching of the conductive film. Note that dry etching is preferably used in terms of microfabrication of the element. An etching gas and an etchant can be selected as appropriate in accordance with a material of a layer to be etched. In this embodiment, a titanium film is used as the conductive film and an In—Ga—Zn—O-based material is used for the oxide semiconductor layer 531; accordingly, in the case of employing wet etching, an ammonia hydrogen peroxide solution (a 31 wt. % hydrogen peroxide solution: 28 wt. % ammonia water:water=5:2:2) can be used as an etchant.

Next, plasma treatment using a gas such as $N_2O$, $N_2$, or Ar is preferably performed, so that water, hydrogen, or the like attached to a surface of an exposed portion of the oxide semiconductor layer may be removed. In the case of performing the plasma treatment, an insulating layer 516 serving as a protective insulating film is formed without being exposed to air.

The insulating layer 516 is preferably formed to a thickness of at least 1 nm by a method by which an impurity such as water or hydrogen is not introduced into the insulating layer 516, such as a sputtering method. When hydrogen is contained in the insulating layer 516, entry of hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. As the insulating layer 516, a silicon oxide film, a silicon oxynitride film, an aluminum oxide film, an aluminum oxynitride film, a gallium oxide film, or the like is preferably used.

In this embodiment, a silicon oxide film is formed to a thickness of 200 nm by a sputtering method as the insulating layer 516. The substrate temperature in deposition may be higher than or equal to room temperature (25° C.) and lower than or equal to 300° C., and is 100° C. in this embodiment.

The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target may be used.

In order to remove residual moisture in the deposition chamber for the insulating layer 516 in a manner similar to that of the deposition of the oxide semiconductor film 530, an entrapment vacuum pump (such as a cryopump) is preferably used. When the insulating layer 516 is deposited in the deposition chamber which is evacuated using a cryopump, the impurity concentration in the insulating layer 516 can be reduced. A turbo molecular pump provided with a cold trap may be used as an evacuation unit for removing the residual moisture in the deposition chamber used for forming the insulating layer 516.

A sputtering gas used for depositing the insulating layer 516 is preferably a high-purity gas from which an impurity such as hydrogen or water is removed.

Next, second heat treatment is performed in an inert gas atmosphere or an oxygen gas atmosphere. The second heat treatment is performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. By supply of oxygen from the insulating layer 516 to the oxide semiconductor layer 531, an oxygen vacancy in the oxide semiconductor layer 531 is reduced, whereby an i-type (intrinsic) or substantially i-type oxide semiconductor layer can be formed.

In this embodiment, the second heat treatment is performed after the formation of the insulating layer 516; however, the timing of the second heat treatment is not limited thereto. For example, the first heat treatment may be followed by the second heat treatment, or the first heat treatment may also serve as the second heat treatment.

In the above-described manner, through the first heat treatment and the second heat treatment, the oxide semiconductor layer 531 is purified by preventing impurities which are not components of the oxide semiconductor from being contained as much as possible and filling oxygen vacancies in the oxide semiconductor, whereby the oxide semiconductor layer 531 can become an i-type (intrinsic) oxide semiconductor layer.

Figure 11D:
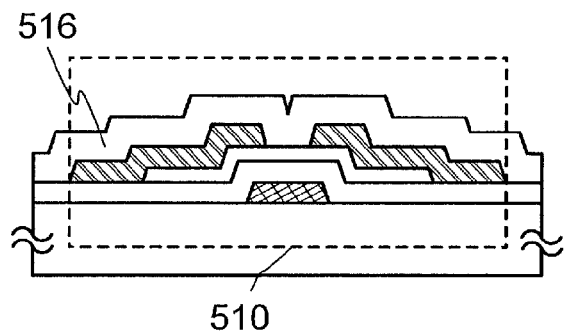

Through the above-described process, the transistor 510 is formed (see FIG. 11D).

Figure 11E:
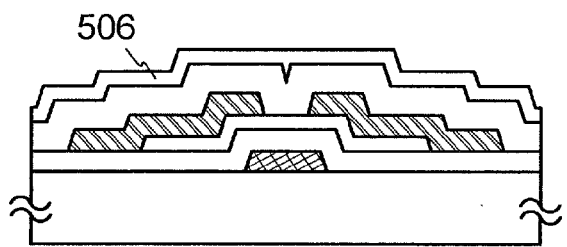
Figure 12A:
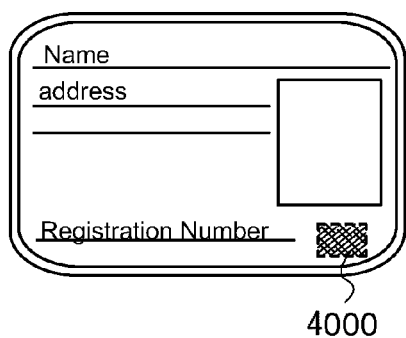
FIGS. 12A to 12F are views illustrating usage examples of an RFID according to one embodiment of the present invention.
Figure 12B:
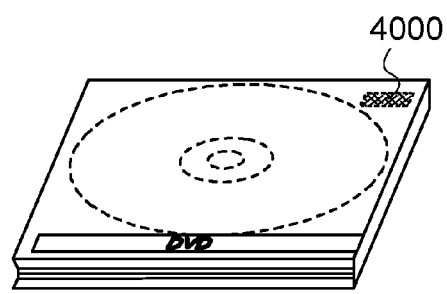
Figure 12C:
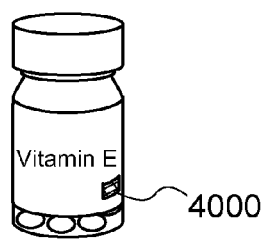
Figure 12D:
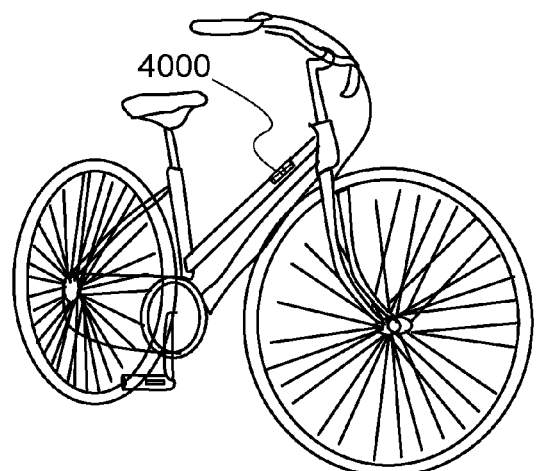
Figure 12E:
Figure 12F:
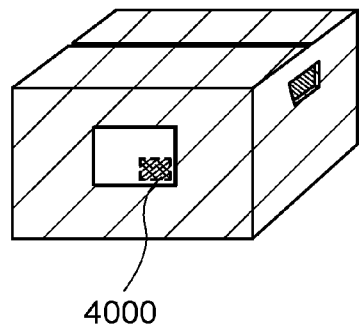

It is preferable to further form a protective insulating layer 506 over the insulating layer 516 (see FIG. 11E). The protective insulating layer 506 prevents entry of hydrogen, water, and the like from the outside. As the protective insulating layer 506, a silicon nitride film, an aluminum nitride film, or the like can be used, for example. The formation method of the protective insulating layer 506 is not particularly limited; however, an RF sputtering method is suitable because of its high productivity. As the protective insulating layer 506, an organic material such as polyimide, acrylic, or benzocyclobutene can be used. With use of such an organic material, an insulating property can be further improved. The protective insulating layer 506 may be a stack of the above materials, and for example, a structure where a polyimide film is stacked over a silicon nitride film can be employed. The protective insulating layer 506 having such a structure can prevent entry of water, hydrogen, or the like and enhance the insulating property.

After the formation of the protective insulating layer 506, heat treatment may be performed at a temperature higher than or equal to 100° C. and lower than or equal to 200° C. for longer than or equal to one hour and shorter than or equal to 30 hours in the air.

With the use of the transistor including the purified oxide semiconductor layer formed according to this embodiment, the leakage current of the transistor can be significantly reduced. Thus, when the transistor is used as a transistor in a rectifier circuit, potential can be held for a longer time and the rectification efficiency of the rectifier circuit can be enhanced.

The structures, methods, and the like described in this embodiment can be combined as appropriate with any of the structures, methods, and the like described in the other embodiments.

Embodiment 7

In this embodiment, application examples of an RF tag including the rectifier circuit of one embodiment of the present invention will be described with reference to FIGS. 12A to 12F. RFID can be employed for a wide range of uses and can be used by being provided for bills, coins, securities, bearer bonds, certificates (driver's licenses, resident cards, and the like; see FIG. 12A), recording media (DVD software, video tapes, and the like; see FIG. 12B), containers for wrapping objects (wrapping paper, bottles, and the like; see FIG. 12C), vehicles (bicycles and the like; see FIG. 12D), personal belongings (bags, glasses, and the like), foods, plants, animals, human bodies, clothes, daily necessities, or products such as electronic devices (liquid crystal display devices, EL display devices, television units, mobile phones, and the like); tags of each product (see FIGS. 12E and 12F); or the like.

An RFID 4000 according to one embodiment of the present invention is fixed to a product by being mounted on a printed board, attached to a surface of the product, or embedded in the product. For example, the RFID 4000 is incorporated in paper of a book or an organic resin package to be fixed to each object. Since the RFID 4000 according to one embodiment of the present invention can be reduced in size, thickness, and weight, it can be fixed to a product without spoiling the design of the product. Further, bills, coins, securities, bearer bonds, certificates, or the like can have an identification function by being provided with the RFID 4000 according to one embodiment of the present invention, and the identification function can be utilized to prevent counterfeiting. Further, when the RFID according to one embodiment of the present invention is attached to containers for wrapping objects, recording media, personal belongings, foods, clothes, daily necessities, electronic devices, or the like, a system such as an inspection system can be efficiently used. Vehicles can also have higher security against theft or the like by being provided with the RFID according to one embodiment of the present invention.

As described above, by using the RFID including a rectifier circuit according to one embodiment of the present invention for each use application described in this embodiment, in the case where the RFID communicating data at a given distance receives, for example, a signal whose transmitted distance is extremely long, the coil is connected to the transistor included in the rectifier circuit, so that the rectification efficiency is improved and a stable operation can be realized; therefore, reliability of authentication or security of an object can be improved.

This application is based on Japanese Patent Application Serial No. 2010-169906 filed with Japan Patent Office on Jul. 29, 2010, the entire contents of which are hereby incorporated by reference.

What is claimed is:

1. A semiconductor device comprising:
an antenna including a first terminal and a second terminal; and
a rectifier circuit comprising:
a first transistor including a first gate electrode, a first source electrode, and a first drain electrode, the first drain electrode being electrically connected to the first terminal of the antenna;
a second transistor including a second gate electrode, a second source electrode, and a second drain electrode, the second drain electrode and the second source electrode being electrically connected to the second terminal of the antenna and to the first drain electrode of the first transistor, respectively;
a first coil at least partially overlapping the antenna and electrically connected between the first gate electrode and the first drain electrode of the first transistor; and
a second coil electrically connected between the second gate electrode and the second drain electrode of the second transistor.

2. A semiconductor device according to claim 1,
wherein the second coil at least partly overlaps with the antenna.

3. A semiconductor device according to claim 1,
wherein the first coil has a stacked-layer structure and comprises at least one element selected among aluminum, chromium, tantalum, titanium, molybdenum, tungsten, silver, copper, gold, platinum, nickel and palladium.

4. A semiconductor device according to claim 1,
wherein the first transistor comprises an oxide semiconductor.

5. A semiconductor device according to claim 1,
wherein the first transistor and the second transistor comprise an oxide semiconductor.

6. An RF tag including the semiconductor device according to claim 1.

7. A semiconductor device according to claim 1,
wherein the second coil at least partly overlaps with the first coil.

8. A semiconductor device comprising:
a coil antenna including a first terminal and a second terminal; and
a rectifier circuit comprising:
a first transistor including a first gate electrode, a first source electrode, and a first drain electrode;
a second transistor including a second gate electrode, a second source electrode, and a second drain electrode, the second drain electrode and the second source electrode being electrically connected to the second terminal of the coil antenna and to the first drain electrode of the first transistor, respectively;
a first coil electrically connected between the first gate electrode and the first drain electrode of the first transistor;
a second coil electrically connected between the second gate electrode and the second drain electrode of the second transistor;
a first capacitor including a third terminal and a fourth terminal, the third terminal and the fourth terminal being electrically connected to the first terminal of the coil antenna and to the first drain electrode of the first transistor, respectively; and
a second capacitor including a fifth terminal and a sixth terminal; the fifth terminal and the sixth terminal being electrically connected to the first source electrode of the first transistor and to the second drain electrode of the second transistor, respectively.

9. A semiconductor device according to claim 8,
wherein the first coil and the second coil at least partly overlap with the coil antenna.

10. A semiconductor device according to claim 8,
wherein the first coil and the second coil have a stacked-layer structure and comprise at least one element selected among aluminum, chromium, tantalum, titanium, molybdenum, tungsten, silver, copper, gold, platinum, nickel and palladium.

11. A semiconductor device according to claim 8,
wherein the first transistor and the second transistor comprise an oxide semiconductor.

12. An RF tag including the semiconductor device according to claim 8.

13. A semiconductor device according to claim 8,
wherein the second coil at least partly overlaps with the first coil.

14. A semiconductor device comprising:
an antenna including a first terminal and a second terminal; and
a rectifier circuit comprising:
a first transistor including a first gate electrode, a first source electrode, and a first drain electrode; the first drain electrode being electrically connected to the first terminal of the antenna;
a second transistor including a second gate electrode, a second source electrode, and a second drain electrode, the second drain electrode and the second source electrode being electrically connected to the second terminal of the antenna and to the first drain electrode of the first transistor, respectively;
a first coil electrically connected between the first gate electrode and the first drain electrode of the first transistor; and
a second coil electrically connected between the second gate electrode and the second drain electrode of the second transistor;
a demodulation circuit electrically connected to the antenna;
a modulation circuit electrically connected to the antenna;
a constant voltage circuit electrically connected to the rectifier circuit;
a clock generation circuit electrically connected to the constant voltage circuit; and
a logic circuit electrically connected to the constant voltage circuit, to the clock generation circuit, to the demodulation circuit and to the modulation circuit.

15. A semiconductor device according to claim 14,
wherein the first coil and the second coil at least partly overlap with the antenna.

16. A semiconductor device according to claim 14,
wherein the first coil and the second coil have a stacked-layer structure and comprise at least one element selected among aluminum, chromium, tantalum, titanium, molybdenum, tungsten, silver, copper, gold, platinum, nickel and palladium.

17. A semiconductor device according to claim 14,
wherein the first transistor and the second transistor comprise an oxide semiconductor.

18. An RF tag including the semiconductor device according to claim 14.

19. A semiconductor device according to claim 14,
wherein the second coil at least partly overlap overlaps with the first coil.

20. A method for manufacturing a semiconductor device comprising the steps of:
- forming on a substrate a transistor including a semiconductor layer, a gate insulating layer, a gate electrode, a source electrode, and a drain electrode;
- forming a first insulating layer over the transistor;
- forming a source electrode layer, a drain electrode layer and connection electrode layers over the first insulating layer, the source electrode layer and the drain electrode layer being in electrical contact with the source electrode and the drain electrode of the transistor, respectively;
- forming a second insulating layer over the source electrode layer, the drain electrode layer, the connection electrode layers and the first insulating layer;
- forming a coil over the second insulating layer, the coil being in electrical contact with one of the connection electrode layers;
- forming a third insulating layer over the coil and the second insulating layer; and
- forming an antenna over the third insulating layer.

21. The method for manufacturing a semiconductor device according to claim 20,
- wherein the coil includes a conductive layer containing an element selected from aluminum, chromium, tantalum, titanium, molybdenum, tungsten, silver, copper, gold, platinum, nickel and palladium.

22. The method for manufacturing a semiconductor device according to claim 20,
- wherein any of the first insulating layer, the second insulating layer and the third insulating layer includes an organic layer.

23. The method for manufacturing a semiconductor device according to claim 20, further comprising the step of forming a first inorganic insulating layer over the antenna,
- wherein the second insulating layer includes a second inorganic insulating layer; and
- wherein the first inorganic insulating layer and the second inorganic insulating layer are in direct contact outside of an antenna portion of the semiconductor device.

24. The method for manufacturing a semiconductor device according to claim 20,
- wherein the semiconductor layer is an oxide semiconductor layer.

25. The method for manufacturing a semiconductor device according to claim 20,
- wherein the antenna is formed by depositing and patterning a conductive layer over the third insulating layer.

26. A method for manufacturing a semiconductor device comprising the steps of:
- forming on a substrate a transistor including a semiconductor layer, a gate insulating layer, a gate electrode, a source electrode, and a drain electrode;
- forming a first insulating layer over the transistor;
- forming a source electrode layer, a drain electrode layer and connection electrode layers over the first insulating layer, the source electrode layer and the drain electrode layer being in electrical contact with the source electrode and the drain electrode of the transistor, respectively;
- forming a second insulating layer over the source electrode layer, the drain electrode layer, the connection electrode layers and the first insulating layer;
- forming a first coil over the second insulating layer, the first coil being in electrical contact with one of the connection electrode layers;
- forming a third insulating layer over the first coil,
- forming a second coil over the third insulating layer;
- forming a fourth insulating layer over the second coil and the third insulating layer; and
- forming an antenna over the fourth insulating layer.

27. The method for manufacturing a semiconductor device according to claim 26,
- wherein the first coil and the second coil each include a conductive layer containing an element selected from aluminum, chromium, tantalum, titanium, molybdenum, tungsten, silver, copper, gold, platinum, nickel and palladium.

28. The method for manufacturing a semiconductor device according to claim 26,
- wherein any of the first insulating layer, the second insulating layer, the third insulating layer and the fourth insulating layer includes an organic material.

29. The method for manufacturing a semiconductor device according to claim 26, further comprising the step of forming a first inorganic insulating layer over the antenna,
- wherein the second insulating layer includes a second inorganic insulating layer; and
- wherein the first inorganic insulating layer and the second inorganic insulating layer are in direct contact outside of an antenna portion of the semiconductor device.

30. The method for manufacturing a semiconductor device according to claim 26,
- wherein the semiconductor layer is an oxide semiconductor layer.

31. The method for manufacturing a semiconductor device according to claim 26,
- wherein the antenna is formed by depositing and patterning a conductive layer over the fourth insulating layer.

* * * * *

UNITED STATES PATENT AND TRADEMARK OFFICE
CERTIFICATE OF CORRECTION

| | | |
|---|---|---|
| PATENT NO. | : 8,540,161 B2 | Page 1 of 1 |
| APPLICATION NO. | : 13/187777 | |
| DATED | : September 24, 2013 | |
| INVENTOR(S) | : Yutaka Shionoiri et al. | |

It is certified that error appears in the above-identified patent and that said Letters Patent is hereby corrected as shown below:

In the Claims

In claim 19, column 34, line 66, "least partly overlap overlaps" should be --least partly overlaps--.

Signed and Sealed this
Eighteenth Day of February, 2014

Michelle K. Lee
*Deputy Director of the United States Patent and Trademark Office*